United States Patent
Kang et al.

(10) Patent No.: US 11,227,870 B2
(45) Date of Patent: Jan. 18, 2022

(54) SEMICONDUCTOR MEMORY DEVICE AND METHOD FOR FABRICATING THE SAME

(71) Applicant: SAMSUNG ELECTRONICS CO., LTD., Suwon-si (KR)

(72) Inventors: Joo-Heon Kang, Seoul (KR); Tae Hun Kim, Gwacheon-si (KR); Jae Ryong Sim, Hwaseong-si (KR); Kwang Young Jung, Hwaseong-si (KR); Gi Yong Chung, Seoul (KR); Jee Hoon Han, Hwaseong-si (KR); Doo Hee Hwang, Uiwang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 83 days.

(21) Appl. No.: 16/739,392

(22) Filed: Jan. 10, 2020

(65) Prior Publication Data

US 2020/0395377 A1 Dec. 17, 2020

(30) Foreign Application Priority Data

Jun. 13, 2019 (KR) .................. 10-2019-0069847

(51) Int. Cl.
*H01L 27/11578* (2017.01)
*H01L 27/11582* (2017.01)
*H01L 27/1157* (2017.01)

(52) U.S. Cl.
CPC .... *H01L 27/11582* (2013.01); *H01L 27/1157* (2013.01)

(58) Field of Classification Search
CPC ................................................ H01L 27/11578
See application file for complete search history.

(56) References Cited

U.S. PATENT DOCUMENTS

| 8,928,063 | B2 | 1/2015 | Kim et al. |
| 9,136,275 | B2 | 9/2015 | Yoo |
| 9,362,303 | B2 | 6/2016 | Lee et al. |
| 9,627,391 | B2 | 4/2017 | Yamashita |
| 9,793,124 | B2 | 10/2017 | Hopkins |
| 9,960,180 | B1 * | 5/2018 | Zhou ................. H01L 29/40117 |
| 2015/0099339 | A1 * | 4/2015 | Kim .................. H01L 27/11582 438/269 |
| 2015/0220269 | A1 | 8/2015 | Lee et al. |

FOREIGN PATENT DOCUMENTS

JP 2011-023586 A 2/2011

* cited by examiner

*Primary Examiner* — Christopher A Johnson
(74) *Attorney, Agent, or Firm* — Lee IP Law, PC

(57) ABSTRACT

A semiconductor memory device includes a third insulating pattern and a first insulating pattern on a substrate, the third insulating pattern and the first insulating pattern being spaced apart from each other in a first direction that is perpendicular to the substrate such that a bottom surface of the third insulating pattern and a top surface of the first insulating pattern face each other, a gate electrode between the bottom surface of the third insulating pattern and the top surface of the first insulating pattern, and including a first side extending between the bottom surface of the third insulating pattern and the top surface of the first insulating pattern, and a second insulating pattern that protrudes from the first side of the gate electrode by a second width in a second direction, the second direction being different from the first direction.

20 Claims, 24 Drawing Sheets

FIG. 1
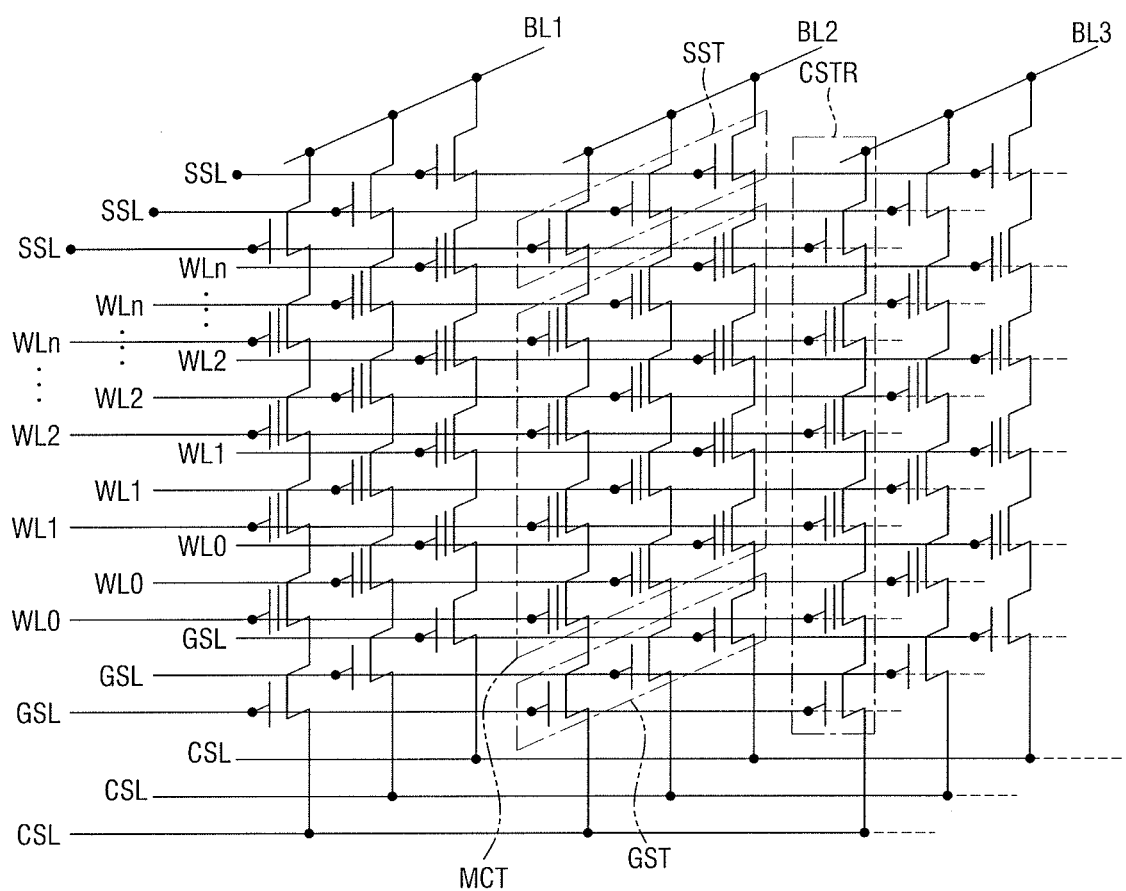
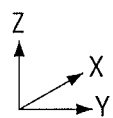

FIG. 15
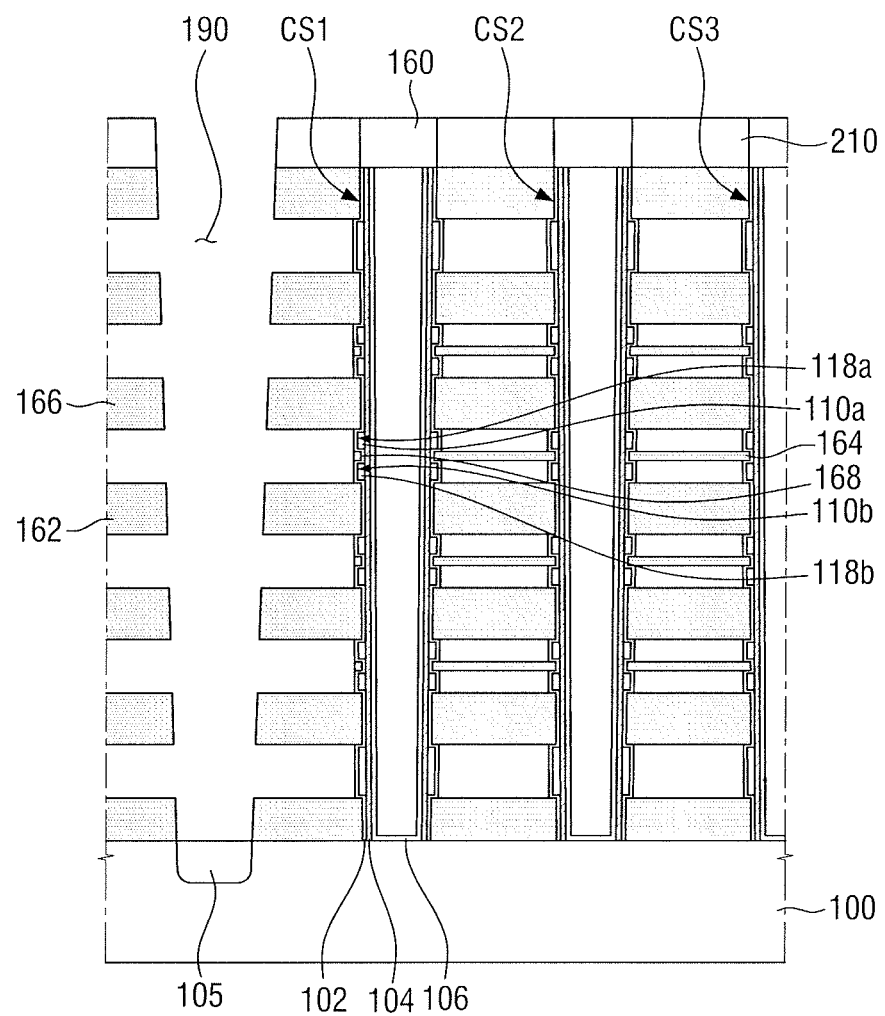
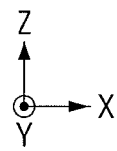

SEMICONDUCTOR MEMORY DEVICE AND METHOD FOR FABRICATING THE SAME

Korean Patent Application No. 10-2019-0069847 filed on Jun. 13, 2019, in the Korean Intellectual Property Office, and entitled: "Semiconductor Memory Device and Method for Fabricating the Same," is incorporated by reference herein in its entirety.

BACKGROUND

1. Field

Embodiments relate to a semiconductor memory device and a method for fabricating the same.

2. Description of the Related Art

In order to satisfy the excellent performance and low costs required by consumers, the degree of integration of non-volatile memory devices have been increasing. However, in the case of two-dimensional or planar memory devices, since their integration density is determined by an area occupied by a unit memory cell, an increase in integration density has become increasingly difficult. Therefore, in recent years, three-dimensional memory devices in which unit memory cells are vertically arranged have been developed to increase integration density without increasing the occupied area.

SUMMARY

Embodiments are directed to a semiconductor memory device, including a third insulating pattern and a first insulating pattern on a substrate, the third insulating pattern and the first insulating pattern being spaced apart from each other in a first direction that is perpendicular to the substrate such that a bottom surface of the third insulating pattern and a top surface of the first insulating pattern face each other, a gate electrode between the bottom surface of the third insulating pattern and the top surface of the first insulating pattern, and including a first side extending between the bottom surface of the third insulating pattern and the top surface of the first insulating pattern, and a second insulating pattern that protrudes from the first side of the gate electrode by a second width in a second direction, the second direction being different from the first direction.

Embodiments are also directed to a semiconductor memory device, including a semiconductor pattern on a substrate and extending in a first direction that is perpendicular to the substrate, a tunnel insulating film on the semiconductor pattern, a first charge storage film and a second charge storage film on the tunnel insulating film and spaced apart from each other in the first direction, a blocking insulating film that extends on the tunnel insulating film along the first charge storage film and the second charge storage film, a recess between the first charge storage film and the second charge storage film, and defined within the blocking insulating film, an insulating pattern that fills the recess, and a gate electrode on the insulating pattern and the blocking insulating film.

Embodiments are also directed to a semiconductor memory device, including a blocking insulating film that extends in a first direction perpendicular to a substrate, a first recess and a second recess defined within one surface of the blocking insulating film and spaced apart from each other in the first direction, a third recess defined within an opposite surface of the blocking insulating film, and between the first recess and the second recess, a first charge storage film that fills the first recess, a second charge storage film that fills the second recess, an insulating pattern that fills the third recess, and a gate electrode that extends along the insulating pattern and the blocking insulating film.

BRIEF DESCRIPTION OF THE DRAWINGS

Features will become apparent to those of skill in the art by describing in detail example embodiments with reference to the attached drawings in which:

FIG. 1 illustrates a schematic circuit diagram for describing a semiconductor memory device according to an example embodiment.

FIGS. 7 to 18 illustrate views showing intermediate processes in a method for fabricating the semiconductor memory device of FIG. 2 according to an example embodiment.

DETAILED DESCRIPTION

FIG. 1 is a schematic circuit diagram for describing a semiconductor memory device according to an example embodiment.

Referring to FIG. 1, a semiconductor memory device according to an example embodiment may include a plurality of word lines WL0 to WLn, a common source line CSL, a plurality of bit lines BL1 to BL3, and a plurality of cell strings CSTR.

The word lines WL0 to WLn may be spaced apart from each other in a first direction Z. The bit lines BL1 to BL3 may be two-dimensionally arranged. For example, the bit lines BL1 to BL3 may be spaced apart from each other in a second direction Y and may extend in a third direction X. The cell strings CSTR may be connected in parallel with each other to each of the bit lines BL1 to BL3. The cell strings CSTR may be commonly connected to the common source line CSL. Thus, the cell strings CSTR may be between the bit lines BL1 to BL3 and the common source line CSL.

In an example embodiment, a plurality of common source lines CSL may be two-dimensionally arranged. For example, the common source lines CSL may extend in the second direction Y while being spaced apart from each other. A same voltage may be applied to the common source lines CSL, or mutually different voltages may be applied to the common source lines CSL to control the common source lines CSL separately.

Each of the cell strings CSTR may include a ground selection transistor GST connected to the common source line CSL, a string selection transistor SST connected to each of the bit lines BL1 to BL3, and a plurality of memory cell transistors MCT between the ground selection transistor GST and the string selection transistor SST. Each of the memory cell transistors MCT may include a data storage element. The ground selection transistor GST, the string selection transistor SST, and the memory cell transistors MCT may be connected in series.

The common source line CSL may be commonly connected to sources of the ground selection transistors GST. A ground selection line GSL, a plurality of word lines WL0 to WLn, and a string selection line SSL may be between the common source line CSL and each of the bit lines BL1 to BL3. The ground selection line GSL may be used as a gate electrode of the ground selection transistor GST. The word lines WL0 to WLn may be used as gate electrodes of the memory cell transistors MCT. The string selection line SSL may be used as a gate electrode of the string selection transistor SST.

Figure 2:
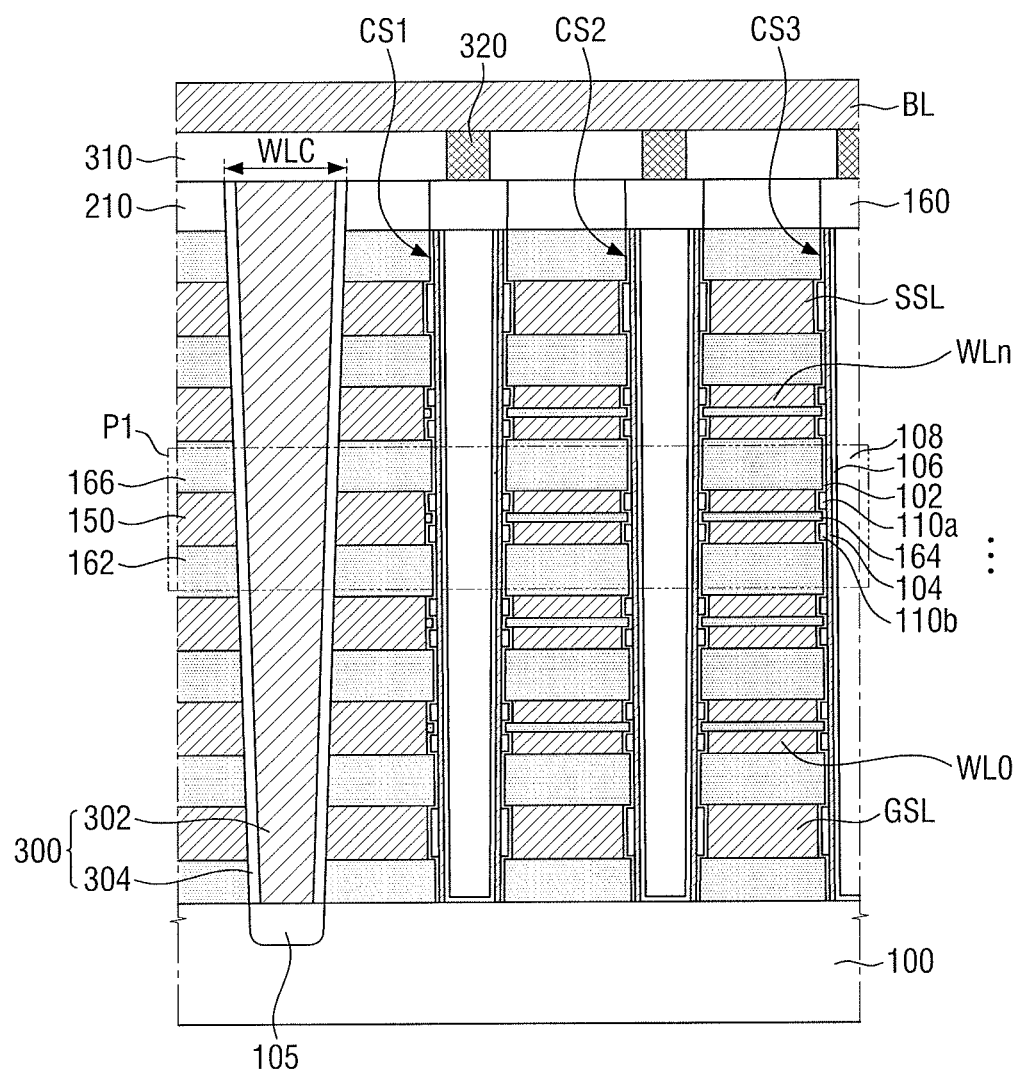
FIG. 2 illustrates a sectional view of a semiconductor memory device according to an example embodiment.

FIG. 2 is a sectional view of a semiconductor memory device according to an example embodiment.

Referring to FIG. 2, a plurality of gate electrodes GSL, WL0 to WLn, SSL, and 150 are shown. The gate electrodes GSL, WL0 to WLn, and SSL may have the same thicknesses or may have thicknesses that are different from each other.

The bit lines BL1 to BL3 may be collectively referred to and shown as a bit line BL in the drawings for convenience of explanation.

In an example embodiment, the plurality of gate electrodes GSL, WL0 to WLn, SSL, and 150 may include the ground selection line GSL, the word lines WL0 to WLn, and the string selection line SSL. The ground selection line GSL, the word lines WL0 to WLn, and the string selection line SSL may be sequentially stacked on a substrate 100.

As an example, 4 word lines are shown between the ground selection line GSL and the string selection line SSL in FIG. 2, but 8, 16, 32, 64 or more word lines may be stacked between the ground selection line GSL and the string selection line SSL.

Each of the gate electrodes GSL, WL0 to WLn, SSL, and 150 may include a conductive material. For example, each of the gate electrodes GSL, WL0 to WLn, SSL, and 150 may include a metal such as tungsten (W), cobalt (Co), nickel (Ni) and the like, or a semiconductor material such as silicon.

Each of the first, second, and third insulating patterns 162, 164, and 166 may include an insulating material. For example, each of the first, second, and third insulating patterns 162, 164, and 166 may include silicon oxide.

In an example embodiment, the gate electrodes GSL, WL0 to WLn, SSL, and 150 and the first, second, and third insulating patterns 162, 164, and 166 may be separated by a word line cut region WLC. For example, the word line cut region WLC may extend in the second direction Y to cut the gate electrodes GSL, WL0 to WLn, SSL, and 150 and the first, second, and third insulating patterns 162, 164, and 166.

In an example embodiment, a separation structure 300 may be formed in the word line cut region WLC. As shown in FIG. 2, the separation structure 300 may extend to the substrate 100 through the gate electrodes GSL, WL0 to WLn, SSL, and 150 and the first, second, and third insulating patterns 162, 164, and 166. In an example embodiment, the separation structure 300 may include a plug pattern 302 and a spacer 304.

The plug pattern 302 may pass through the gate electrodes GSL, WL0 to WLn, SSL, and 150 and the insulating patterns 162, 164 and 166 so as to be connected to the substrate 100. In an example embodiment, the plug pattern 302 may be provided as a common source line (e.g., CSL of FIG. 1) of the semiconductor memory device according to an example embodiment. For example, the plug pattern 302 may include a conductive material. The plug pattern 302 may be connected to an impurity region 105 in the substrate 100. The impurity region 105 may extend, for example, in the second direction Y.

The spacer 304 may be interposed between the plug pattern 302, and the gate electrodes GSL, WL0 to WLn, SSL, and 150 and the first, second, and third insulating patterns 162, 164, and 166. For example, the spacer 304 may extend along a side surface of the plug pattern 302. The spacer 304 may include an insulating material. Thus, the spacer 304 may electrically isolate the plug pattern 302 from the gate electrodes GSL, WL0 to WLn, SSL, and 150 and the first, second, and third insulating patterns 162, 164, and 166.

A plurality of channel structures CS1 to CS3 may pass through the gate electrodes GSL, WL0 to WLn, SSL, and 150 and the insulating patterns 162, 164 and 166 so as to be connected to the substrate 100. The channel structures CS1 to CS3 may extend in the first direction Z intersecting the gate electrodes GSL, WL0 to WLn, SSL, and 150 and the first, second, and third insulating patterns 162, 164, and 166. For example, each of the channel structures CS1 to CS3 may have a pillar shape extending in the first direction Z. Each of the channel structures CS1 to CS3 may include a semiconductor pattern 106 and a plurality of charge storage films, e.g., first and second charge storage films 110a and 110b.

The semiconductor pattern 106 may pass through the gate electrodes GSL, WL0 to WLn, SSL, and 150 and the insulating patterns 162, 164 and 166 so as to be connected to the substrate 100. For example, the semiconductor pattern 106 may extend in the first direction Z so as to be connected to the substrate 100. The semiconductor pattern 106 is shown as having a cup shape in FIG. 2, but the semiconductor pattern 106 may have various shapes such as a cylindrical shape, a rectangular prism shape, and a filled pillar shape.

The semiconductor pattern 106 may include, for example, at least one of a semiconductor material such as single-crystalline silicon, polycrystalline silicon, an organic semiconductor material, and a carbon nanostructure.

The first and second charge storage films 110a and 110b may be interposed between the semiconductor pattern 106 and the gate electrodes GSL, WL0 to WLn, SSL, and 150. The first and second charge storage films 110a and 110b may include, for example, at least one of silicon oxide, silicon nitride, silicon oxynitride, and a high dielectric constant material having a dielectric constant higher than a dielectric constant of silicon oxide. The high dielectric constant material may include, for example, at least one of aluminum oxide, hafnium oxide, lanthanum oxide, tantalum oxide, titanium oxide, lanthanum hafnium oxide, lanthanum aluminum oxide, dysprosium scandium oxide, and a combination thereof.

In an example embodiment, the first and second charge storage films 110a and 110b may be interposed between a plurality of films. For example, the first and second charge storage films 110a and 110b may be on a tunnel insulating film 104 that is stacked on the semiconductor pattern 106. A blocking insulating film 102 may be conformally formed on the tunnel insulating film 104 and the first and second charge storage films 110a and 110b. The tunnel insulating film 104 may include, for example, silicon oxide or a high dielectric constant material (e.g., aluminum oxide ($Al_2O_3$), hafnium oxide ($HfO_2$)) having a dielectric constant higher than the dielectric constant of silicon oxide. The first and second charge storage films 110a and 110b may include, for example, silicon nitride. The blocking insulating film 102 may include, for example, silicon oxide or a high dielectric constant material (e.g., aluminum oxide ($Al_2O_3$), hafnium oxide ($HfO_2$)) having a dielectric constant higher than the dielectric constant of silicon oxide.

Each of the channel structures CS1 to CS3 may further include a filling insulating pattern 108. The filling insulating pattern 108 may be filled in the cup-shaped semiconductor pattern 106. For example, the semiconductor pattern 106 may conformally extend along side and bottom surfaces of the filling insulating pattern 108. The filling insulating pattern 108 may include, for example, silicon oxide.

In an example embodiment, each of the channel structures CS1 to CS3 may further include a channel pad 160. The channel pad 160 may be connected to tops of the blocking insulating film 102, the tunnel insulating film 104, the semiconductor pattern 106, and the filling insulating pattern 108. For example, the channel pad 160 may be formed within a first interlayer insulating film 210, or may be formed such that the semiconductor pattern 106 extends along a side surface of the channel pad 160. The channel pad 160 may include, for example, polysilicon doped with impurities.

The bit lines BL1 to BL3 may be connected to the channel structures CS1 to CS3. For example, each of the bit lines BL1 to BL3 may be connected to each of the channel structures CS1 to CS3 through a bit line contact 320. The bit line contact 320 may, for example, pass through a second interlayer insulating film 310 to electrically connect each of the channel structures CS1 to CS3 to each of the bit lines BL1 to BL3.

In the case of a region P1 serving as a memory cell, one gate electrode 150 may control one memory cell. Thus, since a first charge storage film 110a and a second charge storage film 110b are formed in one memory cell such that charges are stored in a desired charge storage film, the memory cell may serve as one memory cell in terms of structure, but may operate as two memory cells so that the cell integration density can be increased. That is, assuming that a word line in the region P1 is a third word line WL3, the effect, which can be obtained from two memory cells, can be obtained at the third word line WL3 through one gate electrode 150. Detailed effects, processes, and operations thereof will be described below.

Figure 3:
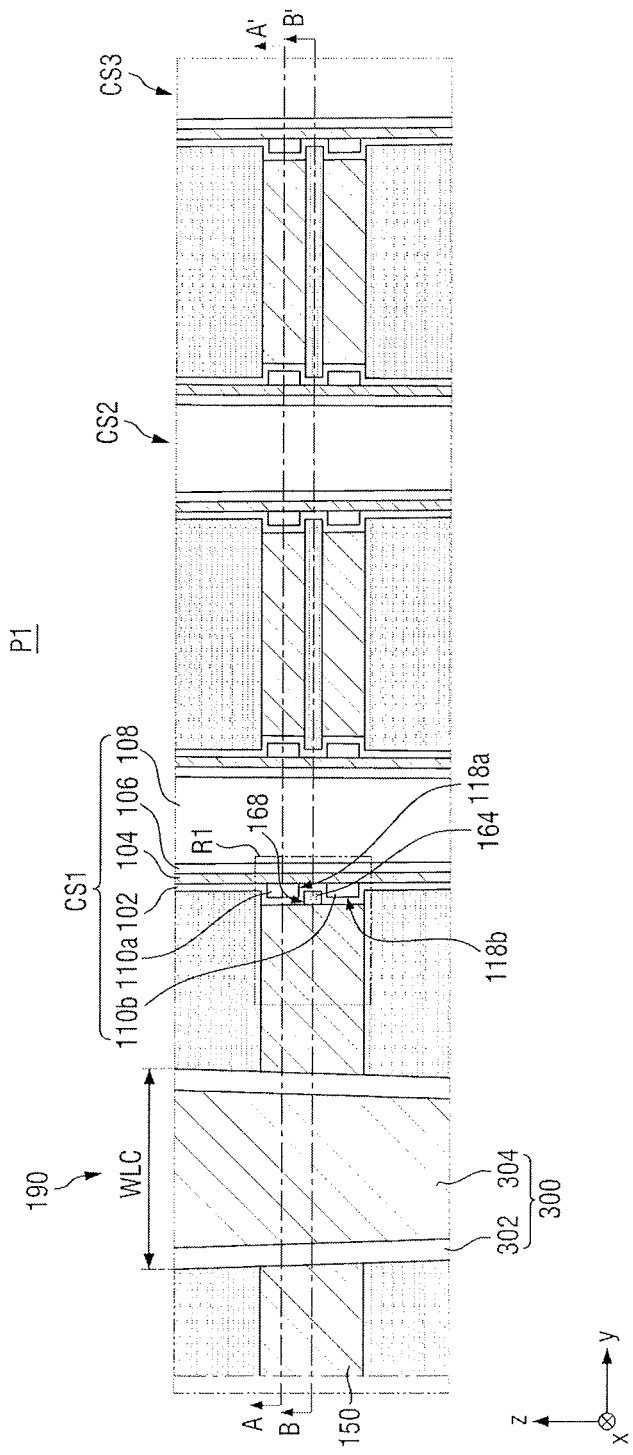
FIG. 3 illustrates an enlarged view of a region P1 of the semiconductor memory device of FIG. 2 according to an example embodiment.

FIG. 3 is an enlarged view of the region P1 of the semiconductor memory device of FIG. 2 according to an example embodiment.

Referring to FIG. 3, the semiconductor memory device includes a first insulating pattern 162, a second insulating pattern 164, a third insulating pattern 166, the first channel structure CS1, the second channel structure CS2, the third channel structure CS3, and the gate electrode 150. The first insulating pattern 162, the second insulating pattern 164, and the third insulating pattern 166 may be collectively referred to as a plurality of insulating patterns 162, 164, and 166, and the first channel structure CS1, the second channel structure CS2, and the third channel structure CS3 may be collectively referred to as a plurality of channel structures CS1, CS2, and CS3.

The first insulating pattern 162, the gate electrode 150, and the third insulating pattern 166 may be stacked in the first direction Z which is perpendicular to the substrate. The second insulating pattern 164 may protrude from the gate electrode 150 in the second direction Y that is parallel to the substrate 100. The first, second, and third insulating patterns 162, 164, and 166, and the gate electrode 150 may extend in the second direction Y.

The first, second, and third insulating patterns 162, 164, and 166 may include, for example, silicon oxide such as borosilicate glass (BSG), phosphosilicate glass (PSG), borophosphosilicate glass (BPSG), undoped silicate glass (USG), tetraethylorthosilicate glass (TEOS), or high density plasma-CVD (HDP-CVD).

A slit region 190 may be formed in the semiconductor memory device according to an example embodiment. The slit region 190 may divide a plurality of stacked structures.

Although not shown, the substrate 100 may include, for example, a semiconductor substrate such as a silicon substrate, a germanium substrate, or a silicon-germanium substrate. In another implementation, the substrate may include a silicon-on-insulator (SOI) substrate or a germanium-on-insulator (GOI) substrate.

Although the first insulating pattern 162 and the third insulating pattern 166 are shown as having the same thickness, the first insulating pattern 162 and the third insulating pattern 166 may have thicknesses that are different from each other.

The gate electrode 150 may be between the first insulating pattern 162 and the third insulating pattern 166, and may include the second insulating pattern 164 configured to protrude from the gate electrode 150 in the second direction Y.

In FIG. 3, only one gate electrode 150 is shown among a plurality of gate electrodes 150. Thus, a plurality of gate electrodes 150 may be provided. In an example embodiment, a lowermost gate electrode 150 may be provided as the ground selection line GSL of FIG. 1. In an example embodiment, an uppermost gate electrode 150 may be provided as the string selection line SSL of FIG. 1. In an example embodiment, gate electrodes 150 between the lowermost and uppermost gate electrodes 150 in the first direction Z may be provided as the word lines WL0 to WLn between the ground selection line GSL and the string selection line SSL of FIG. 1.

The gate electrode 150 may include a conductive material. The gate electrode 150 may include, for example, a metal such as tungsten (W), cobalt (Co), nickel (Ni) and the like, or a semiconductor material such as silicon.

The first, second, and third insulating patterns 162, 164, and 166 may include an insulating material. The first, second, and third insulating patterns 162, 164, and 166 may include, for example, silicon oxide.

The channel structures CS1, CS2, and CS3 may extend in the first direction Z through the first, second, and third insulating patterns 162, 164, and 166, and the gate electrode 150. For example, the channel structures CS1, CS2, and CS3 may be formed in a pillar shape on the substrate 100 so as to pass through the first, second, and third insulating patterns 162, 164, and 166, and the gate electrode 150. Accordingly, the gate electrode 150 may intersect the channel structures CS1, CS2, and CS3.

Each of the channel structures CS1, CS2, and CS3 may include the semiconductor pattern 106. The semiconductor pattern 106 may pass through the first, second, and third insulating patterns 162, 164, and 166, and the gate electrode 150 so as to be connected to the substrate 100. For example, the semiconductor pattern 106 may extend in the first direction Z. The semiconductor pattern 106 may have, for example, a cup shape. For example, each of the channel structures CS1, CS2, and CS3 may include a pillar-shaped filling insulating pattern 108 and the semiconductor pattern 106 configured to conformally extend along a bottom surface and a sidewall of the filling insulating pattern 108. The filling insulating pattern 108 may include, for example, silicon oxide. In other example embodiments, the semiconductor pattern 106 may have various shapes such as a cylindrical shape, a rectangular prism shape, and a filled pillar shape.

The semiconductor pattern 106 may include, for example, a semiconductor material such as single-crystalline silicon.

Each of the channel structures CS1, CS2, and CS3 may include the tunnel insulating film 104. The tunnel insulating film 104 may include, for example, silicon oxide or silicon oxynitride. In another implementation, for example, the tunnel insulating film 104 may be configured as a double layer or the like including a silicon oxide film and a silicon nitride film. For convenience of explanation, the tunnel insulating film 104 will be described below as including silicon oxide.

Each of the channel structures CS1, CS2, and CS3 may include the first charge storage film 110a and the second charge storage film 110b. The first charge storage film 110a and the second charge storage film 110b may be collectively referred to as a plurality of charge storage films 110a and 110b.

The first and second charge storage films 110a and 110b may be formed on a sidewall of the tunnel insulating film 104. Accordingly, the tunnel insulating film 104 may be formed between the semiconductor pattern 106 and the first and second charge storage films 110a and 110b. In addition, each of the first and second charge storage films 110a and 110b may extend in the second direction X, e.g., a +X-direction.

The second insulating pattern 164 may be formed between the first charge storage film 110a and the second charge storage film 110b, and the second insulating pattern 164 may protrude from the gate electrode 150 in the second direction Y while extending in the third direction X.

The first and second charge storage films 110a and 110b may include, for example, at least one of silicon nitride, silicon oxynitride, silicon-rich nitride (Si-rich nitride), and nanocrystalline silicon (nanocrystalline Si). For convenience of explanation, the first and second charge storage films 110a and 110b will be described below as including silicon nitride.

Each of the channel structures CS1, CS2, and CS3 may include the blocking insulating film 102. The blocking insulating film 102 may extend in the first direction Z along the first and second charge storage films 110a and 110b and the tunnel insulating film 104.

A first recess 118a and a second recess 118b formed in one surface of the blocking insulating film 102 may be filled with silicon nitride to form the first charge storage film 110a and the second charge storage film 110b, respectively.

A third recess 168 may be formed in another surface of the blocking insulating film 102, which is opposite from the one surface in which the first recess 118a and the second recess 118b are formed, and may be filled with an insulating material to form the second insulating pattern 164.

The blocking insulating film 102 may be formed on sidewalls, top surfaces, and bottom surfaces of the first and second charge storage films 110a and 110b. Thus, the blocking insulating film 102 may be formed between the gate electrode 150 and the first and second charge storage films 110a and 110b.

The blocking insulating film 102 may be configured to surround the gate electrode 150. For example, the blocking insulating film 102 may extend along a bottom surface, a sidewall, and a top surface of the gate electrode 150. Accordingly, a lower portion of the blocking insulating film 102 may be formed between the gate electrode 150 and the first insulating pattern 162, a side portion of the blocking insulating film 102 may be formed between the gate electrode 150 and the first and second charge storage films 110a and 110b, and an upper portion of the blocking insulating film 102 may be formed between the gate electrode 150 and the third insulating pattern 166.

The blocking insulating film 102 may include, for example, silicon oxide or a high dielectric constant material having a dielectric constant higher than the dielectric constant of silicon oxide. The high dielectric constant material may include, for example, at least one of aluminum oxide, hafnium oxide, lanthanum oxide, tantalum oxide, titanium oxide, lanthanum hafnium oxide, lanthanum aluminum oxide, dysprosium scandium oxide, and a combination thereof. For convenience of explanation, the blocking insulating film 102 will be described below as including silicon oxide.

In the semiconductor memory device according to an example embodiment, the first charge storage film 110a and the second charge storage film 110b may be controlled through one gate electrode 150. Thus, two transistors may be formed in one cell so that the integration density of the semiconductor memory device can be increased.

In the semiconductor memory device according to an example embodiment, when electrons in the semiconductor pattern 106 are injected into the first charge storage film 110a and/or the second charge storage film 110b via the tunnel insulating film 104, the electrons may be injected through hot carrier injection rather than through Fowler-Nordheim tunneling. Thus, a strong potential difference is created inside the semiconductor memory device to accelerate the electrons in the semiconductor pattern 106 so that the electron may have high kinetic energy, and the electrons having the high kinetic energy (i.e., hot carrier) may be trapped in the first charge storage film 110a and/or the second charge storage film 110b.

In the semiconductor memory device according to an example embodiment, for example, when the electrons are injected into the first charge storage film 110a of the first channel structure CS1, a voltage of +V may be applied to the top of the first channel structure CS1 and the gate electrode 150, and a voltage of 0 (or lower than +V) may be applied to the bottom of the first channel structure CS1. A difference between the voltage applied to the top of the first channel structure CS1 and the gate electrode 150 and the voltage applied to the bottom of the first channel structure CS1 may be larger at the first charge storage film 110a than at the second charge storage film 110b. Thus, the electrons of the semiconductor pattern 106 may be trapped in the first charge storage film 110a.

In the semiconductor memory device according to an example embodiment, for example, when the electrons are injected into the second charge storage film 110b of the first channel structure CS1, a voltage of +V may be applied to the bottom of the first channel structure CS1 and the gate electrode 150, and a voltage of 0 (or lower than +V) may be applied to the top of the first channel structure CS1. A difference between the voltage applied to the bottom of the first channel structure CS1 and the gate electrode 150 and the voltage applied to the top of the first channel structure CS1 may be larger at the second charge storage film 110b than at the first charge storage film 110a. Thus, the electrons of the semiconductor pattern 106 may be trapped in the second charge storage film 110b.

In the semiconductor memory device according to an example embodiment, in order to help control the first charge storage film 110a and the second charge storage film 110b as separate transistors through the gate electrode 150, the second insulating pattern 164 configured to protrude from the gate electrode 150 in the second direction Y may be formed between the first charge storage film 110a and the second charge storage film 110b.

Thus, charges trapped in the first charge storage film 110a may be prevented from being trapped in the second charge storage film 110b through the second insulating pattern 164. Conversely, charges trapped in the second charge storage film 110b may be prevented from being trapped in the first charge storage film 110a through the second insulating pattern 164. Accordingly, the performance of the semiconductor memory device may be improved while increasing the integration density of the semiconductor memory device.

In the following description, the interior of the semiconductor memory device according to an example embodiment will be described in detail with reference to FIG. 4.

Figure 4:
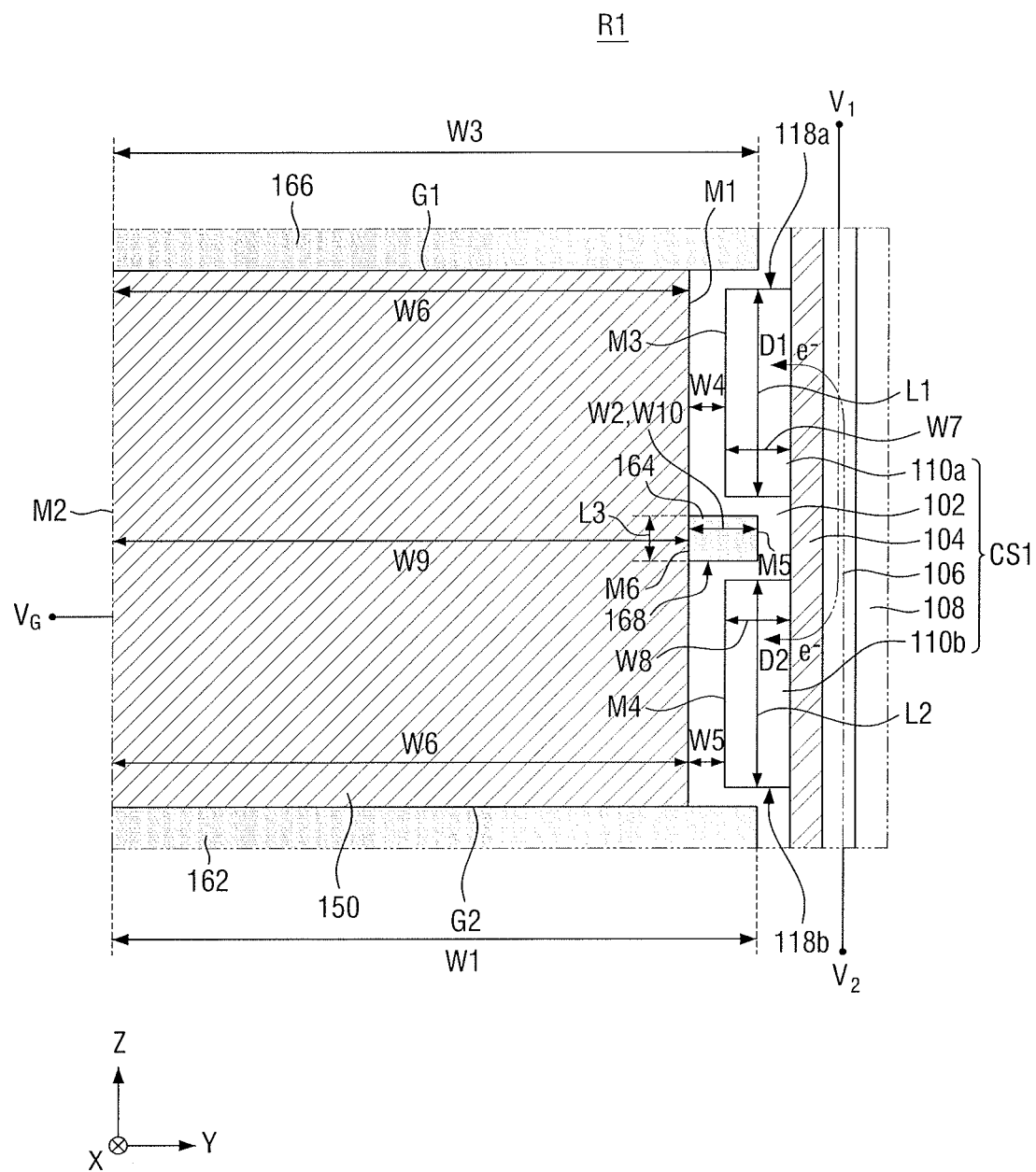
FIG. 4 illustrates an enlarged view of a region R1 of FIG. 3.

FIG. 4 is an enlarged view of a region R1 of FIG. 3.

Referring to FIG. 4, the gate electrode 150 may be formed between a top surface G2 of the first insulating pattern 162 and a bottom surface G1 of the third insulating pattern 166. The first insulating pattern 162 may have a first width W1 in the second direction Y, and the third insulating pattern 166 may have a third width W3 in the second direction Y.

The gate electrode 150 may include a first side M1 and a second side M2 extending between the first insulating pattern 162 and the third insulating pattern 166. The gate electrode 150 may have a sixth width W6 in the second direction Y defined between the first side M1 and the second side M2.

The second insulating pattern 164 may protrude from the first side M1 of the gate electrode 150 by a second width W2 in the second direction Y. The second insulating pattern 164 may have a third length L3 in the first direction Z. The second insulating pattern 164 may include a sixth side M6 where the second insulating pattern 164 meets the gate electrode 150 and a fifth side M5 where the second insulating pattern 164 meets the blocking insulating film 102. The gate electrode 150 may have a ninth width W9 in the second direction Y defined from the second side M2 to the sixth side M6.

The first charge storage film 110a may be formed at an upper portion of the second insulating pattern 164 in the first direction Z, and the second charge storage film 110b may be formed at a lower portion of the second insulating pattern 164 in the first direction Z, with the second insulating pattern 164 being interposed between the first charge storage film 110a and the second charge storage film 110b. The first charge storage film 110a may have a first length L1 in the first direction Z. The first charge storage film 110a may have a seventh width W7 in the second direction Y. The second charge storage film 110b may have a second length L2 in the first direction Z. The second charge storage film 110b may have an eighth width W8 in the second direction Y.

In the semiconductor memory device according to an example embodiment, the third length L3 of the second insulating pattern 164 may be smaller than the first length L1 and/or the second length L2 or, for example, the third length L3 of the second insulating pattern 164 may be larger than ½ of the first length L1 and/or the second length L2. When the third length L3 of the second insulating pattern 164 becomes longer, the charges trapped between or in the first charge storage film 110a and/or the second charge storage film 110b may be more efficiently separated.

The first length L1 of the first charge storage film 110a and the second length L2 of the second charge storage film 110b are shown as being the same, but the first length L1 of the first charge storage film 110a and the second length L2 of the second charge storage film 110b may be different from each other.

The first charge storage film 110a may be spaced apart from the first side M1 by a fourth width W4. The second charge storage film 110b may be spaced apart from the first side M1 by a fifth width W5. The fourth width W4 and the fifth width W5 are shown as being the same, but the fourth width W4 and the fifth width W5 may be different from each other.

The first charge storage film 110a includes a third side M3 where the first charge storage film 110a meets the blocking insulating film 102, and the second charge storage film 110b includes a fourth side M4 where the second charge storage film 110b meets the blocking insulating film 102. The blocking insulating film 102 may conformally extend in the first direction Z along the first, second, and third insulating patterns 162, 164, and 166, the gate electrode 150, the first and second charge storage films 110a and 110b, and the tunnel insulating film 104.

The first charge storage film 110a and the second charge storage film 110b may be formed, for example, by filling the first recess 118a and the second recess 118b, which are formed in one surface of the blocking insulating film 102, with a silicon nitride film, respectively. The second insulating pattern 164 may be formed by filling the third recess 168, which is formed in the other surface of the blocking insulating film 102 with an insulating material.

The first width W1 of the first insulating pattern 162 and the third width W3 of the third insulating pattern 166 may be the same, for example. A distance from the first side M1 to the second side M2, that is, the sixth width W6 of the gate electrode 150 in the second direction Y, may be smaller than the first width W1 and/or the third width W3.

A length from the second side M2 to the fifth side M5 is equal to the sum of the ninth width W9 and the second width W2 of the projecting portion of the second insulating pattern 162. The ninth width W9 may be the same as the sixth width W6, or may be less than the sixth width W6 (see FIG. 20).

A length from the second side M2 to the third side M3 is equal to the sum of the sixth width W6 and the fourth width W4. A length from the second side M2 to the fourth side M4 is equal to the sum of the sixth width W6 and the fifth width W5.

Although the sum of the sixth width W6 and the fourth width W4 may be the same as the sum of the sixth width W6 and the fifth width W5 as shown in the drawings, the sum of the sixth width W6 and the fourth width W4 and the sum of the sixth width W6 and the fifth width W5 may be different from each other.

In the semiconductor memory device according to an example embodiment, the sum of the sixth width W6 and the second width W2 may be larger than the sum of the sixth width W6 and the fourth width W4. The sum of the sixth width W6 and the second width W2 may be larger than the sum of the sixth width W6 and the fifth width W5.

As described above, the semiconductor memory device according to an example embodiment may independently store the charges in the first charge storage film 110a and the second charge storage film 110b through one gate electrode 150.

For example, referring to a two-dot chain line arrow direction along a direction D2 in FIG. 4, a gate voltage $V_G$ may be applied to the gate electrode 150. The gate voltage $V_G$ may be, for example, a positive voltage. A first voltage V1 may be applied to a top of the semiconductor pattern 106, and a second voltage V2 different from the first voltage V1 may be applied to a bottom of the semiconductor pattern 106. In one example, the first voltage V1 may be a ground voltage, and the second voltage V2 may be a positive voltage. In this case, the charges (electrons) provided from the top of the semiconductor pattern 106 may be selectively trapped in the second charge storage film 110b.

As another example, referring to a two-dot chain line arrow direction along a direction D1 in FIG. 4, the gate voltage $V_G$ may be applied to the gate electrode 150. The gate voltage $V_G$ may be, for example, a positive voltage. The first voltage V1 may be applied to the top of the semiconductor pattern 106, and the second voltage V2 different from the first voltage V1 may be applied to the bottom of the semiconductor pattern 106. In one example, the first voltage V1 may be a positive voltage, and the second voltage V2 may be a ground voltage. In this case, the charges (electrons) provided from the bottom of the semiconductor pattern 106 may be selectively trapped in the first charge storage film 110a.

Accordingly, the semiconductor memory device according to an example embodiment may implement two data storage elements per each gate electrode 150. Therefore, a semiconductor memory device with improved integration density may be provided.

Figure 5:
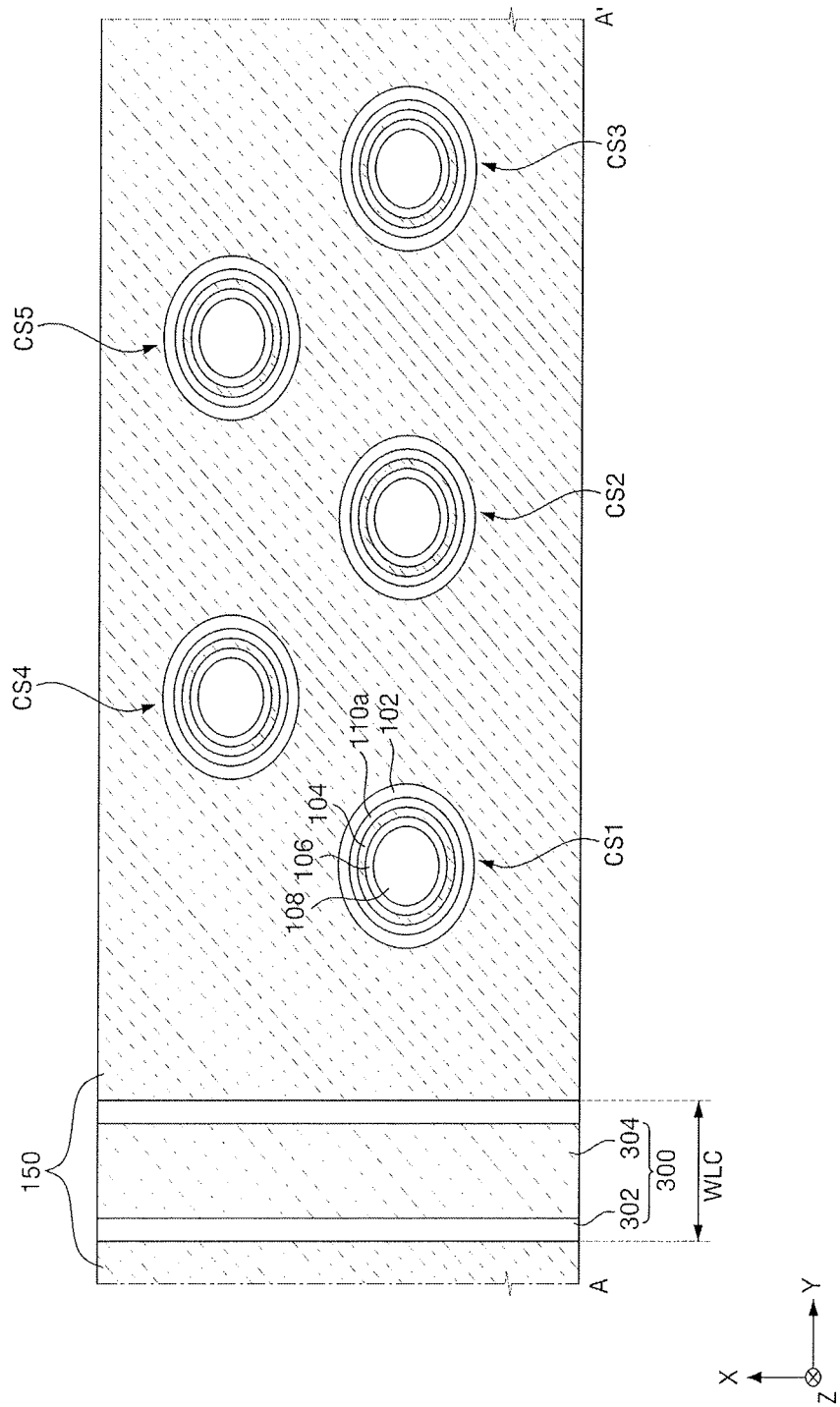
FIG. 5 illustrates a sectional view taken along line A-A' in FIG. 3.

FIG. 5 is a sectional view taken along line A-A' in FIG. 3.

Referring to FIG. 5, the semiconductor memory device according to an example embodiment may be separated through the slit region 190. The semiconductor memory device according to an example embodiment includes the first channel structure CS1, the second channel structure CS2, the third channel structure CS3, a fourth channel structure CS4, and a fifth channel structure CS5, which are connected to the gate electrode 150. In each of the first to fifth channel structures CS1, CS2, CS3, CS4, and CS5, the filling insulating pattern 108, the semiconductor pattern 106, the tunnel insulating film 104, the first charge storage film 110a, and the blocking insulating film 102 may be sequentially formed.

In the following description, a section formed by the insulating pattern between the first charge storage film 110a and the second charge storage film 110b in the semiconductor memory device according to an example embodiment will be described with reference to FIG. 6.

Figure 6:
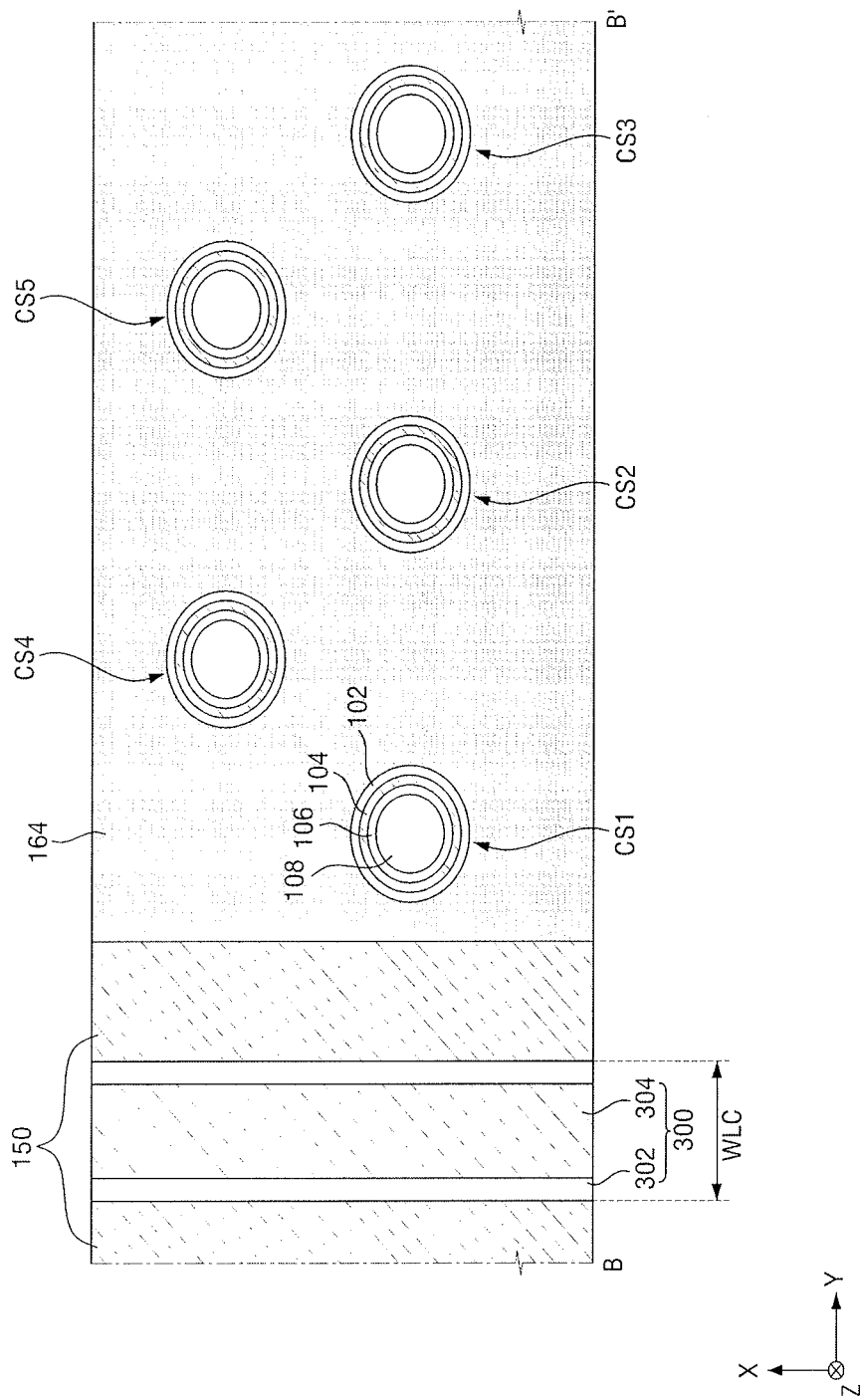
FIG. 6 illustrates a sectional view taken along line B-B' in FIG. 3.

FIG. 6 is a sectional view taken along line B-B' in FIG. 3.

Referring to FIG. 6, the semiconductor memory device according to an example embodiment may be separated through the slit region 190. The semiconductor memory device according to an example embodiment includes the first channel structure CS1, the second channel structure CS2, the third channel structure CS3, the fourth channel structure CS4, and the fifth channel structure CS5, which are insulated through the second insulating pattern 164. In each of the first to fifth channel structures CS1, CS2, CS3, CS4, and CS5, the filling insulating pattern 108, the semiconductor pattern 106, the tunnel insulating film 104, and the blocking insulating film 102 may be sequentially formed.

In the semiconductor memory device according to an example embodiment, the first charge storage film 110a is isolated from the second charge storage film 110b of FIG. 3 by the second insulating pattern 164 so that charge trap interference between the first charge storage film 110a and the second charge storage film 110b can be prevented from occurring.

FIGS. 7 to 18 are views showing intermediate processes for describing a method for fabricating the semiconductor memory device of FIG. 2 according to an example embodiment.

Figure 7:
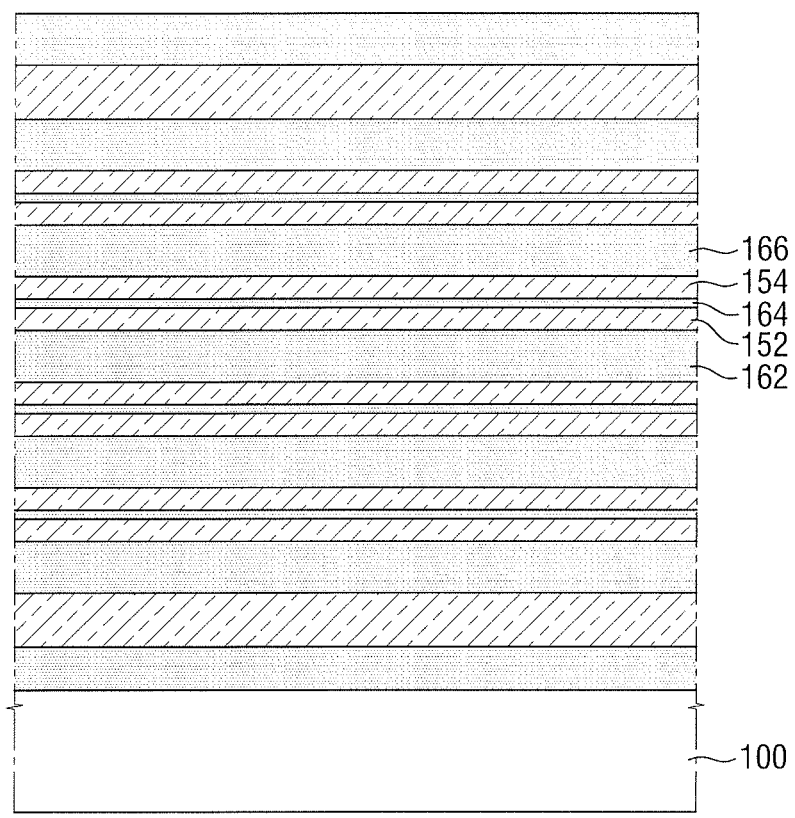

Referring to FIG. 7, the first insulating pattern 162, a first sacrificial film 152, the second insulating pattern 164, a second sacrificial film 154, and the third insulating pattern 166 are sequentially stacked on the substrate 100.

Although the first sacrificial film 152 and the second sacrificial film 154 are shown as having the same thickness, the first sacrificial film 152 and the second sacrificial film 154 may have thicknesses that are different from each other.

The first sacrificial film 152 and the second sacrificial film 154 may include, for example, at least one of silicon nitride, silicon oxynitride, silicon-rich nitride (Si-rich nitride), and nanocrystalline silicon (nanocrystalline Si). For convenience of explanation, the first sacrificial film 152 and the second sacrificial film 154 will be described below as including silicon nitride. The first sacrificial film 152 and the second sacrificial film 154 may define a region where the gate electrode 150 is formed.

Figure 8:
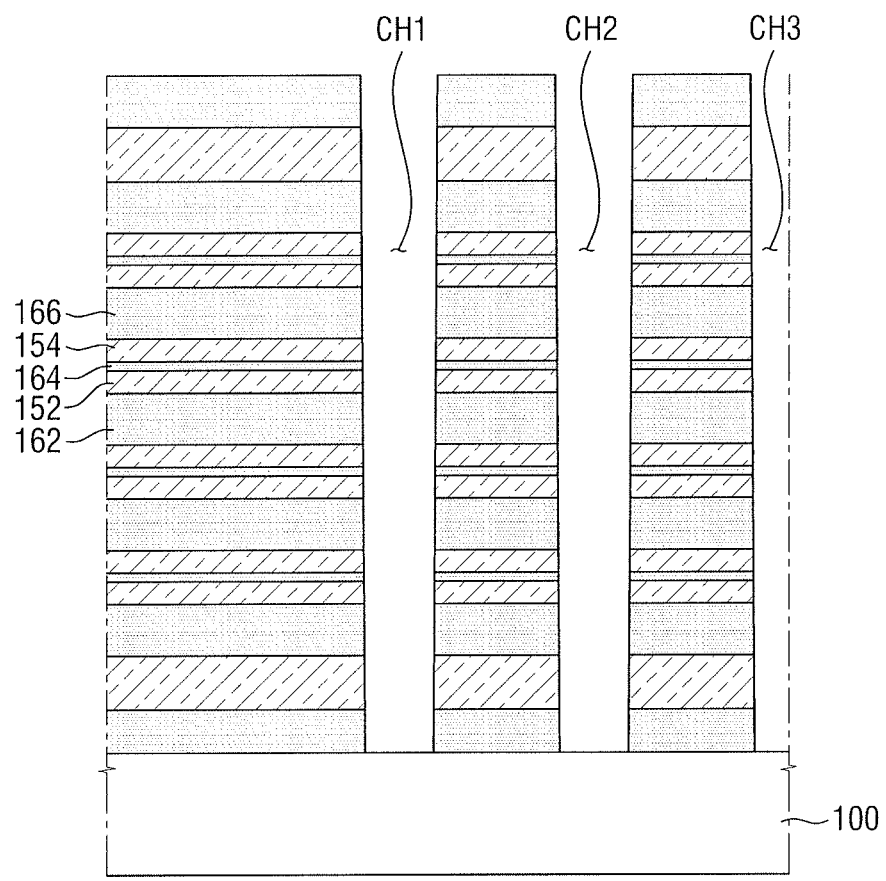

Referring to FIG. 8, a first channel hole CH1, a second channel hole CH2, and a third channel hole CH3 may be formed in the first insulating pattern 162, the first sacrificial film 152, the second insulating pattern 164, the second sacrificial film 154, and the third insulating pattern 166, which are stacked.

In the following description, the first channel hole CH1 will be described as an example. The first insulating pattern 162, the first sacrificial film 152, the second insulating pattern 164, the second sacrificial film 154, and the third insulating pattern 166, which are stacked, may be etched to form the first channel hole CH1 configured to pass through the first insulating pattern 162, the first sacrificial film 152, the second insulating pattern 164, the second sacrificial film 154, and the third insulating pattern 166, which are stacked. The first channel hole CH1 may be configured to expose a part of the substrate 100 by passing through the first insulating pattern 162, the first sacrificial film 152, the second insulating pattern 164, the second sacrificial film 154, and the third insulating pattern 166, which are stacked. In an example embodiment, forming the first channel hole CH1 may include etching a part of a top portion of the substrate 100.

In an example embodiment, the first channel hole CH1 may have a tapered shape. For example, a width of the first channel hole CH1 may become narrower toward the bottom in the first direction Z. Such a shape of the first channel hole CH1 may result from characteristics of an etching process for forming the first channel hole CH1.

Figure 9:
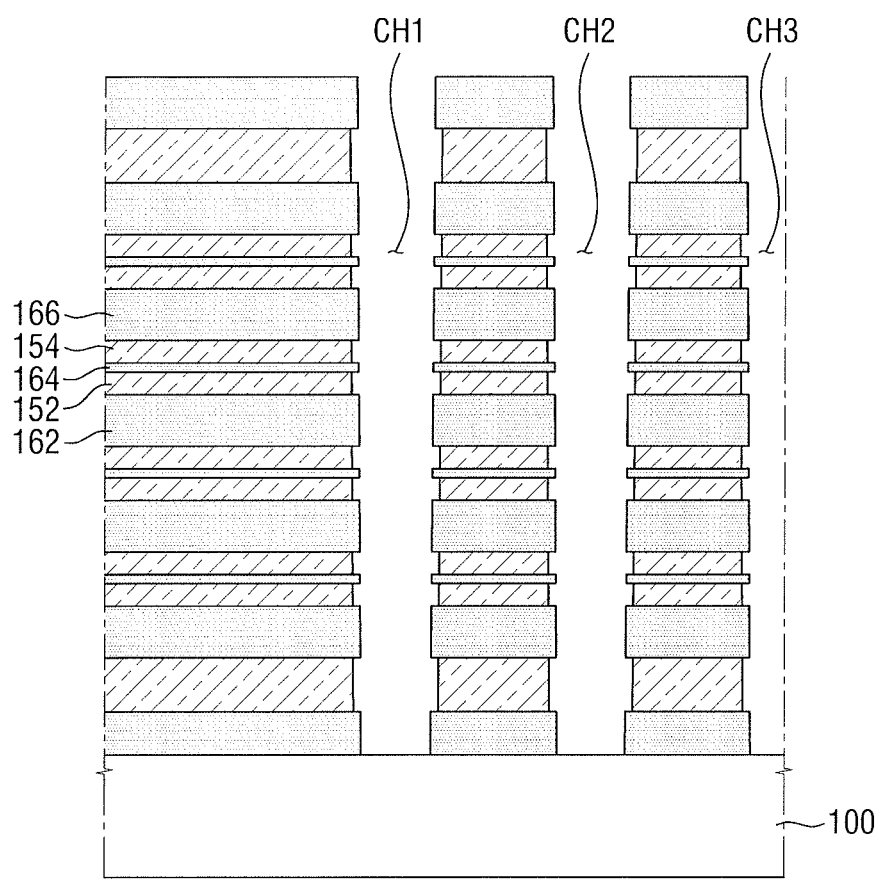

Referring to FIG. 9, parts of the first sacrificial film 152 and the second sacrificial film 154 (exposed by the first channel hole CH1, the second channel hole CH2, and the third channel hole CH3) may be removed. For example, an etchback process may be performed on the first sacrificial film 152 and the second sacrificial film 154 to form recesses in the first sacrificial film 152 and the second sacrificial film 154.

Figure 10:
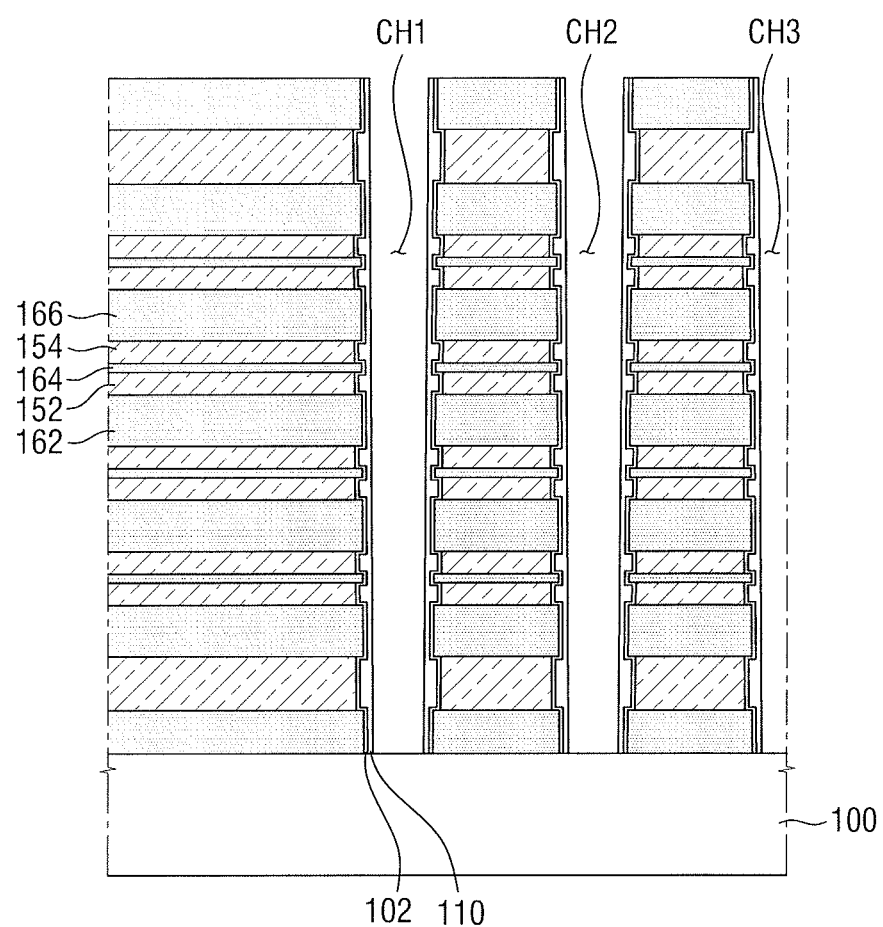

Referring to FIG. 10, the blocking insulating film 102 and a preliminary charge storage film 110 may be sequentially formed in each of the channel holes CH1 to CH3. In the following description, the first channel hole CH1 will be described as an example.

First, the blocking insulating film 102 that extends along a profile of the first channel hole CH1 may be formed. The blocking insulating film 102 may extend along side surfaces of the first sacrificial film 152, the second sacrificial film 154, the first insulating pattern 162, the second insulating pattern 164, and the third insulating pattern 166.

Next, the preliminary charge storage film 110 may be formed on the blocking insulating film 102. The preliminary charge storage film 110 may extend along a profile of the blocking insulating film 102.

Figure 11:
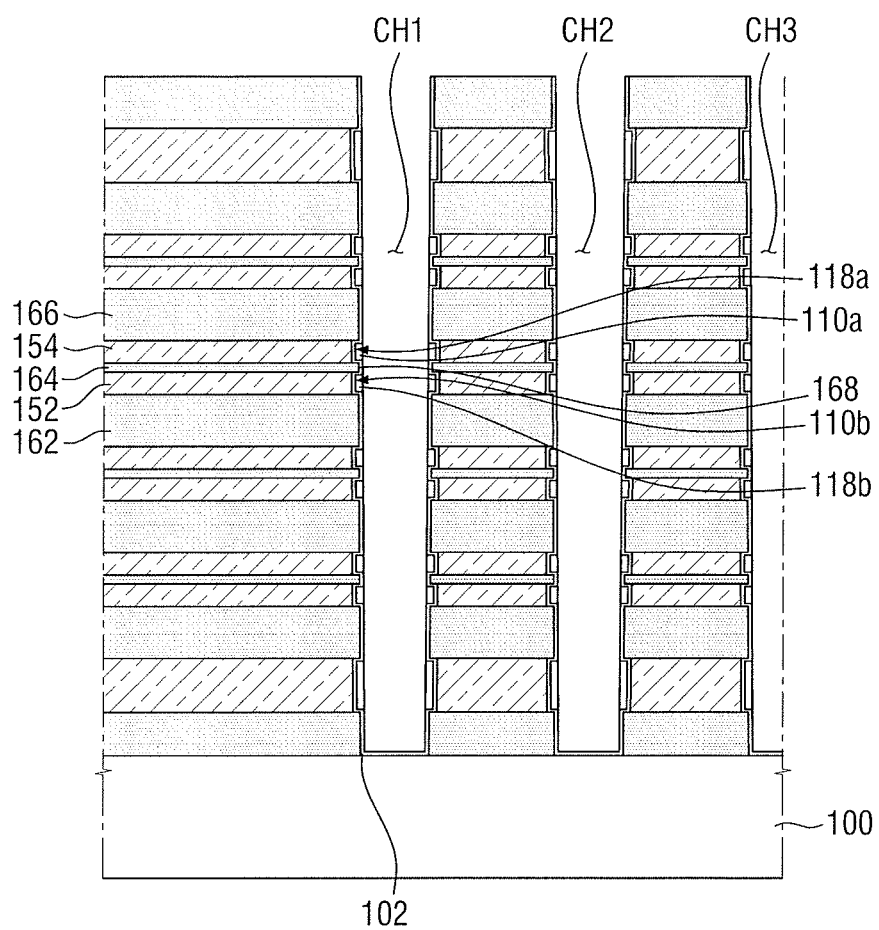

Referring to FIG. 11, the etchback process may be performed on the preliminary charge storage film 110. The etchback process according to an example embodiment may be performed through wet etching. In an example embodiment, the etchback process may be performed until a side surface of the blocking insulating film 102 is exposed. Accordingly, a plurality of charge storage films, e.g., the first charge storage film 110a and the second charge storage film 110b, may be formed to be spaced apart from each other between the first, second, and third insulating patterns 162, 164, and 166.

The first and second charge storage films 110a and 110b may be embedded in the sacrificial films 154 and 152, respectively. For example, the first charge storage film 110a may fill at least a part of the first recess 118a formed in the second sacrificial film 154, and the second charge storage film 110b may fill at least a part of the second recess 118b formed in the first sacrificial film 152.

A width of the first charge storage film 110a and a width of the second charge storage film 110b are shown as being equal to each other as an example. A depth of the first charge storage film 110a and a depth of the second charge storage film 110b are shown as being equal to each other as an example.

Figure 12:
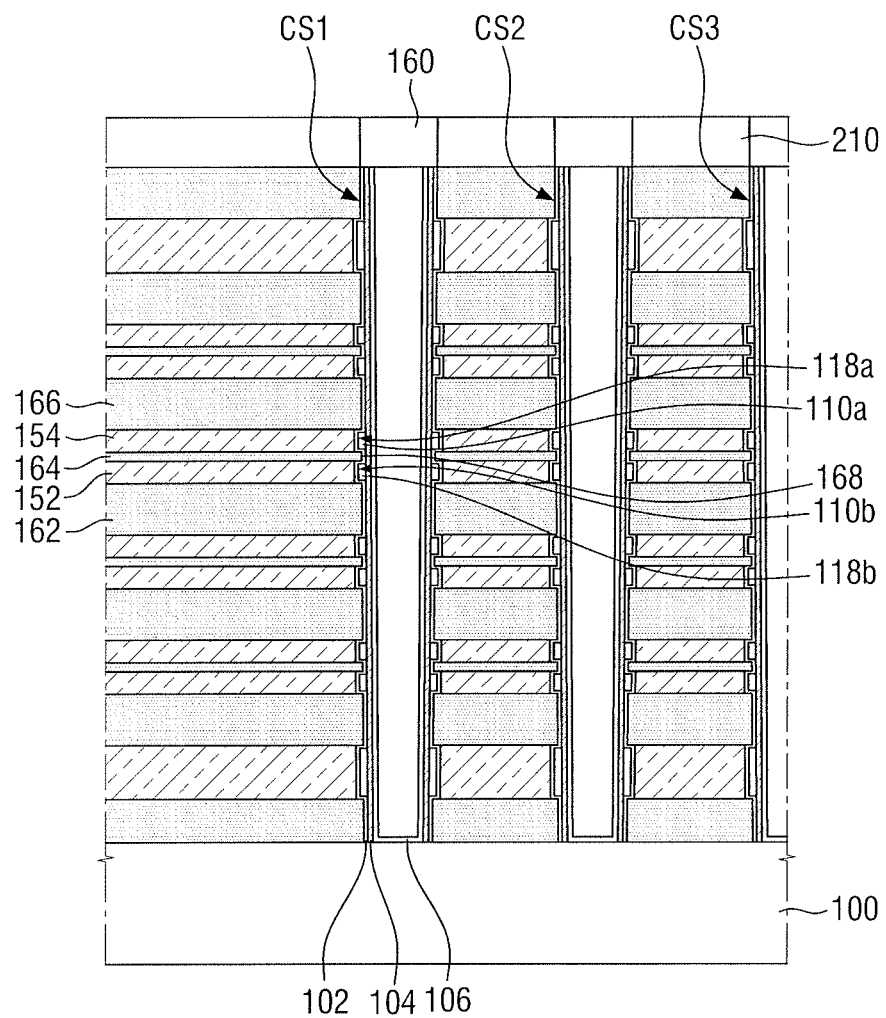

Referring to FIG. 12, the first interlayer insulating film 210 and the channel pad 160 may be formed on the channel structures CS1 to CS3.

Figure 13:
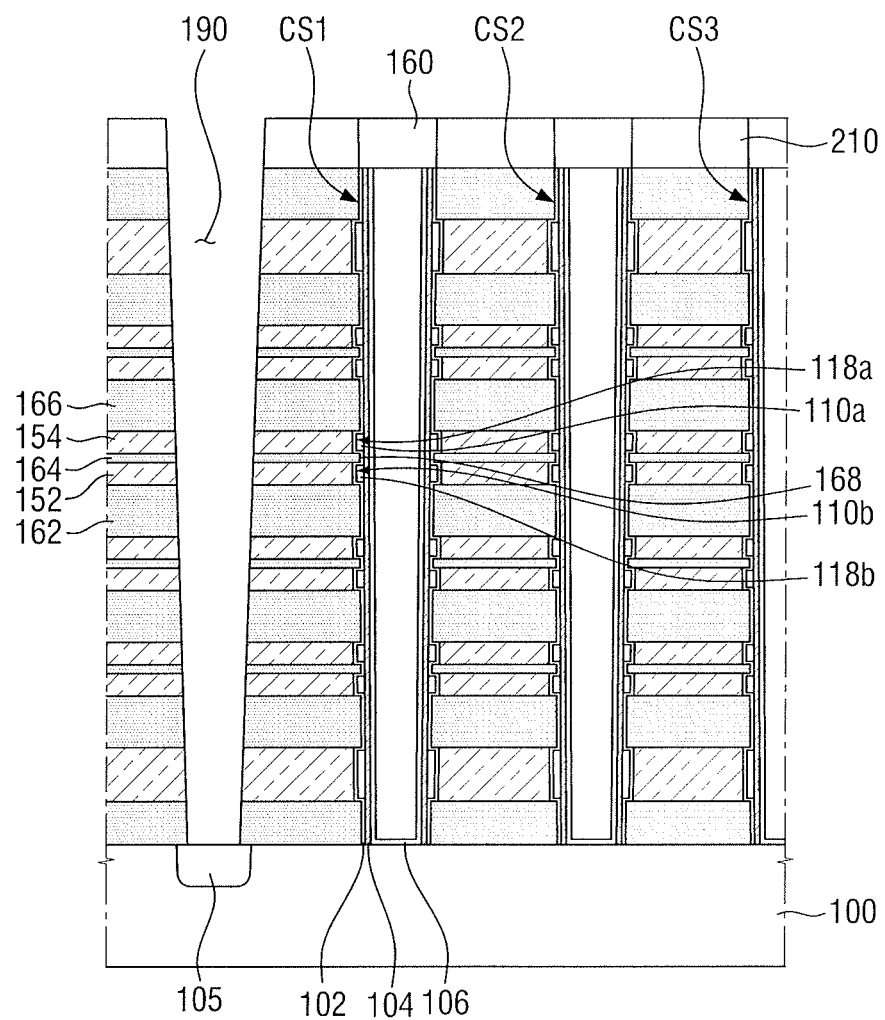

Referring to FIG. 13, the slit region 190 may be formed in the first, second, and third insulating patterns 162, 164, and 166 and the sacrificial films 152 and 154. The slit region 190 may be configured to expose the substrate 100 by passing through the first, second, and third insulating patterns 162, 164, and 166 and the sacrificial films 152 and 154. Accordingly, the slit region 190 may cut the first, second, and third insulating patterns 162, 164, and 166 and the sacrificial films 152 and 154. In an example embodiment, the slit region 190 may extend in the second direction Y.

In an example embodiment, the impurity region 105 may be formed in the substrate 100 exposed by the slit region 190.

Figure 14:
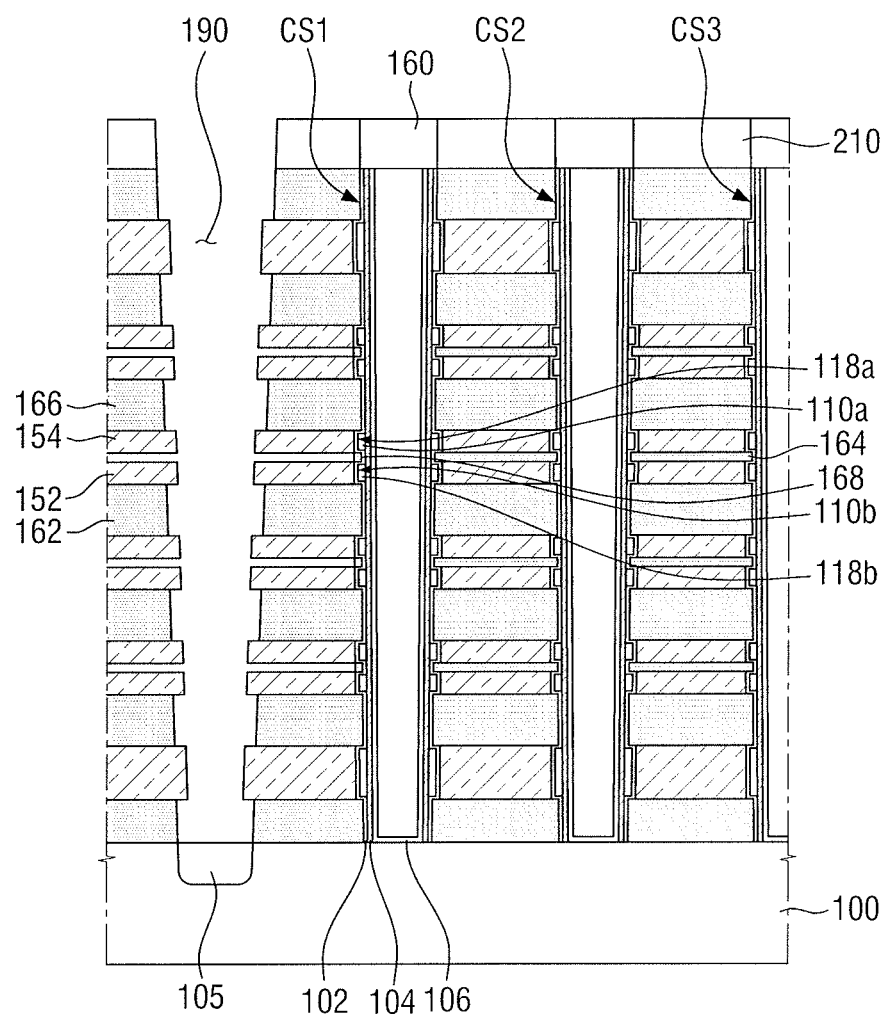

Referring to FIG. 14, parts of the first, second, and third insulating patterns 162, 164, and 166 exposed by the slit region 190 may be removed.

Referring to FIG. 15, the sacrificial films 152 and 154 exposed by the slit region 190 may be removed. Removing the sacrificial films 152 and 154 may be performed, for example, by an anisotropic etching process. Accordingly, in some embodiments, a part of the side surface of the blocking insulating film 102 may be exposed.

Figure 16:
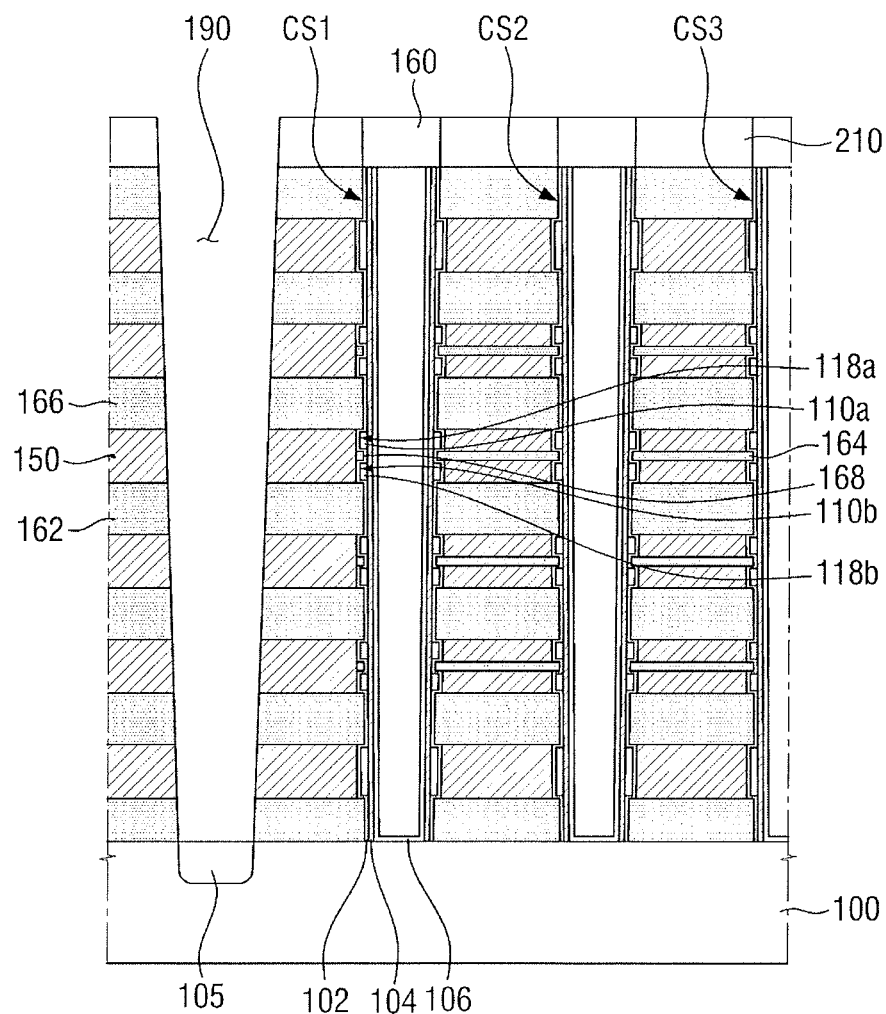

Referring to FIG. 16, the gate electrode 150 may be formed by filling a region from which the sacrificial films 152 and 154 are removed with a conductive material.

Figure 17:
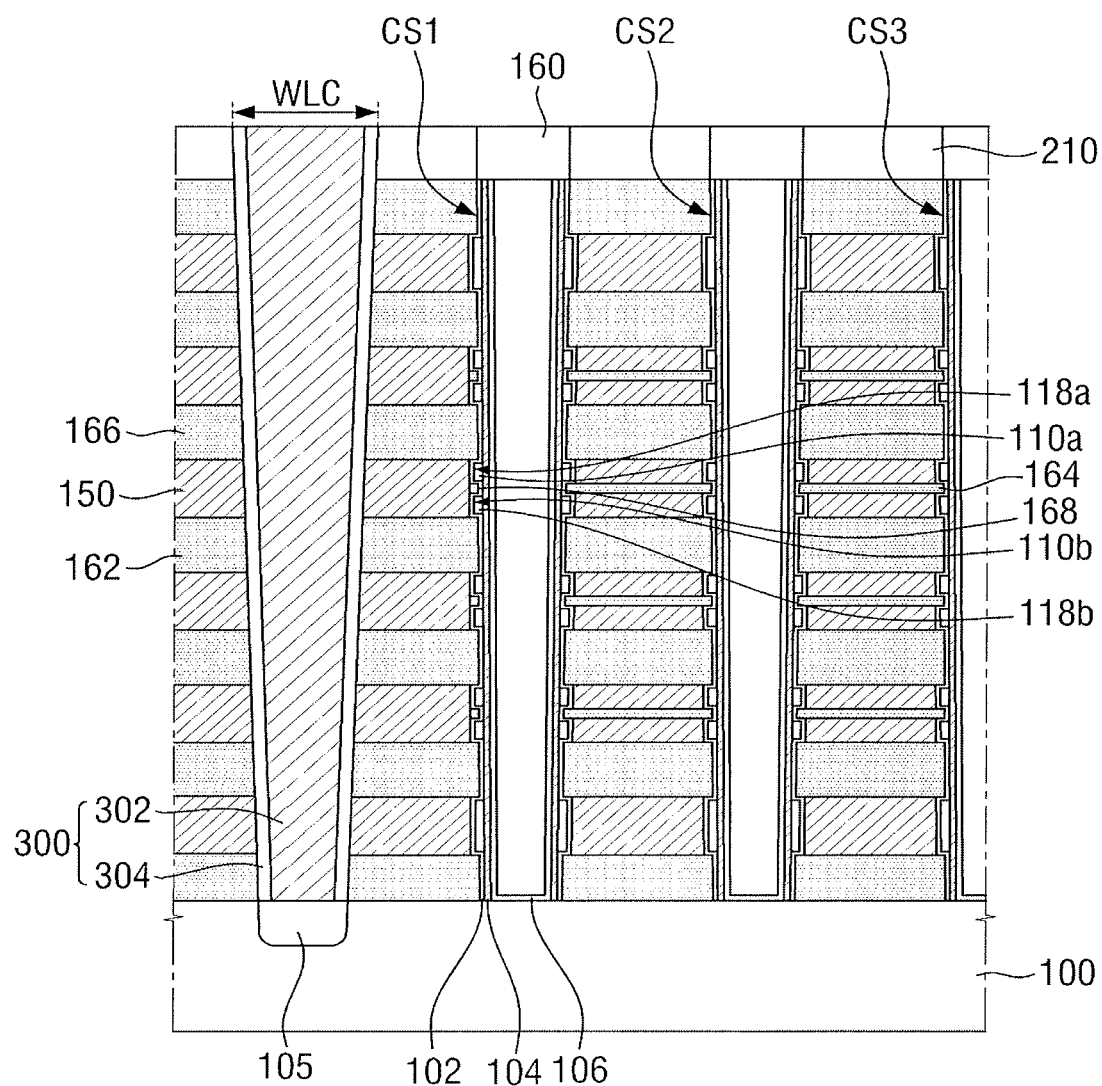

Referring to FIG. 17, the separation structure 300 may be formed in the slit region 190 to form the word line cut region WLC. For example, the spacer 304 that extends along a profile of the word line cut region WLC may be formed. Then, on the spacer 304, the plug pattern 302 that fills the word line cut region WLC may be formed.

Then, referring again to FIG. 2, the second interlayer insulating film 310 may be formed on the word line cut region WLC, the first interlayer insulating film 210, and the channel pad 160. The bit line contact 320 making contact with the channel pad 160 may be formed inside the second interlayer insulating film 310. The bit line BL may be formed on the bit line contact 320 and the second interlayer insulating film 310 so that the semiconductor memory device of FIG. 2 according to an example embodiment may be formed.

Figure 18:
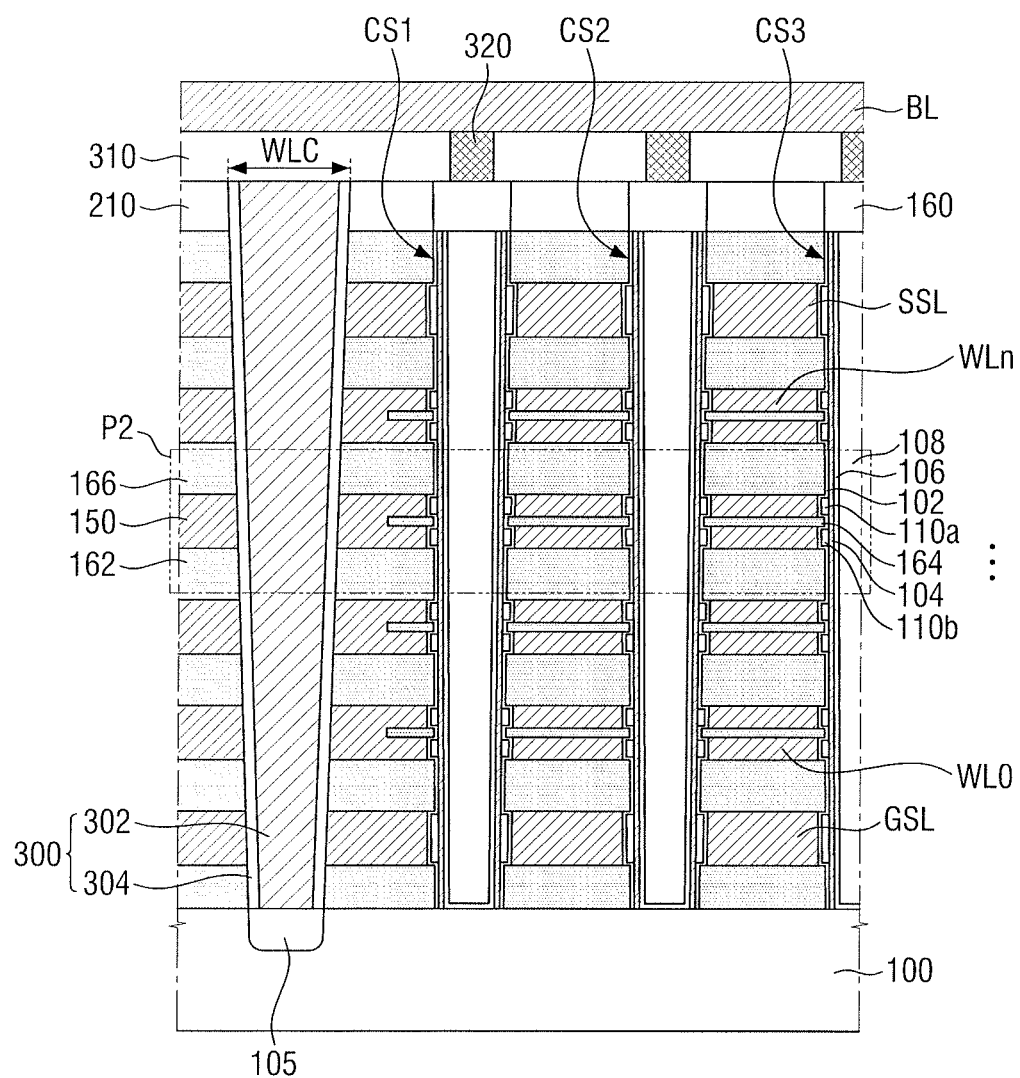

FIG. 18 is an example sectional view of a semiconductor memory device according to an example embodiment. The following description will be made while focusing on differences from FIG. 2, and an overlapping description already set forth with reference to FIG. 2 may be omitted.

Referring to FIG. 18, unlike in FIG. 2, there is a difference in that the second insulating pattern 164 penetrates further into the gate electrode 150 in the third direction X in the word lines WL0 to WLn.

In the case of a region P2 serving as a memory cell, one gate electrode 150 may control one memory cell. Thus, since a first charge storage film 110a and a second charge storage film 110b are formed in one memory cell such that charges are stored in a desired charge storage film, the memory cell may serve as one memory cell in terms of structure, but may operate as two memory cells so that the cell integration density can be increased. That is, assuming that a word line in the region P2 is a third word line WL3, the effect, which can be obtained from two memory cells, can be obtained at the third word line WL3 through the one gate electrode 150. Detailed effects, processes, and operations thereof will be described below.

Figure 19:
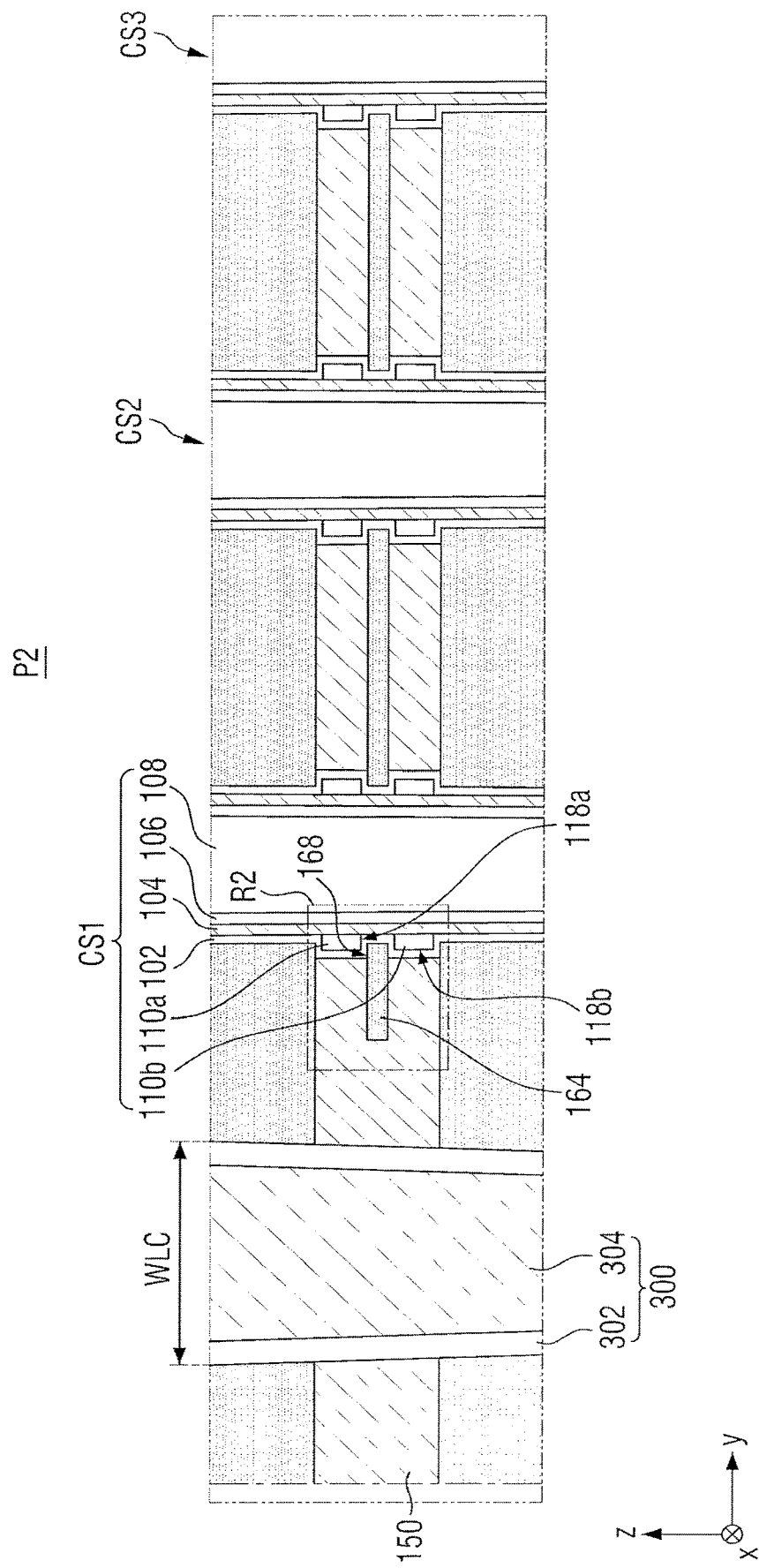
FIG. 19 illustrates an enlarged view of a region P2 of the semiconductor memory device of FIG. 18 according to an example embodiment.

FIG. 19 is an enlarged view of the region P2 of the semiconductor memory device of FIG. 18 according to an example embodiment. The following description will be made except for an overlapping part described with reference to FIG. 3.

Referring to FIG. 19, at least a part of the second insulating pattern 164 may be formed within the gate electrode 150.

In the semiconductor memory device according to an example embodiment, the first charge storage film 110a and the second charge storage film 110b may be controlled through one gate electrode 150. Thus, two transistors are formed in one cell so that the integration density of the semiconductor memory device may be increased.

In the semiconductor memory device according to an example embodiment, when electrons in the semiconductor pattern 106 are injected into the first charge storage film 110a and/or the second charge storage film 110b via the tunnel insulating film 104, the electrons may be injected through hot carrier injection rather than through Fowler-Nordheim tunneling. Thus, a strong potential difference may be created inside the semiconductor memory device to accelerate the electrons in the semiconductor pattern 106 so that the electron may have high kinetic energy, and the electrons having the high kinetic energy (i.e., hot carrier) may be trapped in the first charge storage film 110a and/or the second charge storage film 110b.

In the semiconductor memory device according to an example embodiment, for example, when the electrons are injected into the first charge storage film 110a of the first channel structure CS1, a voltage of +V may be applied to the top of the first channel structure CS1 and the gate electrode 150, and a voltage of 0 (or lower than +V) may be applied to the bottom of the first channel structure CS1. A difference between the voltage applied to the top of the first channel structure CS1 and the gate electrode 150 and the voltage applied to the bottom of the first channel structure CS1 may be larger at the first charge storage film 110a than at the second charge storage film 110b. Thus, the electrons of the semiconductor pattern 106 may be trapped in the first charge storage film 110a.

In the semiconductor memory device according to an example embodiment, for example, when the electrons are injected into the second charge storage film 110b of the first channel structure CS1, a voltage of +V may be applied to the bottom of the first channel structure CS1 and the gate electrode 150, and a voltage of 0 (or lower than +V) may be applied to the top of the first channel structure CS1. A difference between the voltage applied to the bottom of the first channel structure CS1 and the gate electrode 150 and the voltage applied to the top of the first channel structure CS1 may be larger at the second charge storage film 110b than at the first charge storage film 110a. Thus, the electrons of the semiconductor pattern 106 may be trapped in the second charge storage film 110b.

In the semiconductor memory device according to an example embodiment, in order to help control the first charge storage film 110a and the second charge storage film 110b as separate transistors through the gate electrode 150, the second insulating pattern 164 that extends from an inside of the gate electrode 150 in the second direction Y may be formed between the first charge storage film 110a and the second charge storage film 110b. Thus, charges trapped in the first charge storage film 110a may be prevented from being trapped in the second charge storage film 110b through the second insulating pattern 164. Conversely, charges trapped in the second charge storage film 110b may be prevented from being trapped in the first charge storage film 110a through the second insulating pattern 164. Accordingly, the performance of the semiconductor memory device may be improved while increasing the integration density of the semiconductor memory device.

The voltage by the gate electrode 150 on an extension line of the first charge storage film 110a in the second direction Y may be prevented from reaching the second charge storage film 110b, and the voltage by the gate electrode 150 on an extension line of the second charge storage film 110b in the second direction Y may be prevented from reaching the first charge storage film 110a. Thus, the first charge storage film 110a and the second charge storage film 110b may be controlled as separate transistors through one gate electrode 150 so that the performance of the semiconductor memory device may be improved while increasing the integration density of the semiconductor memory device.

Figure 20:
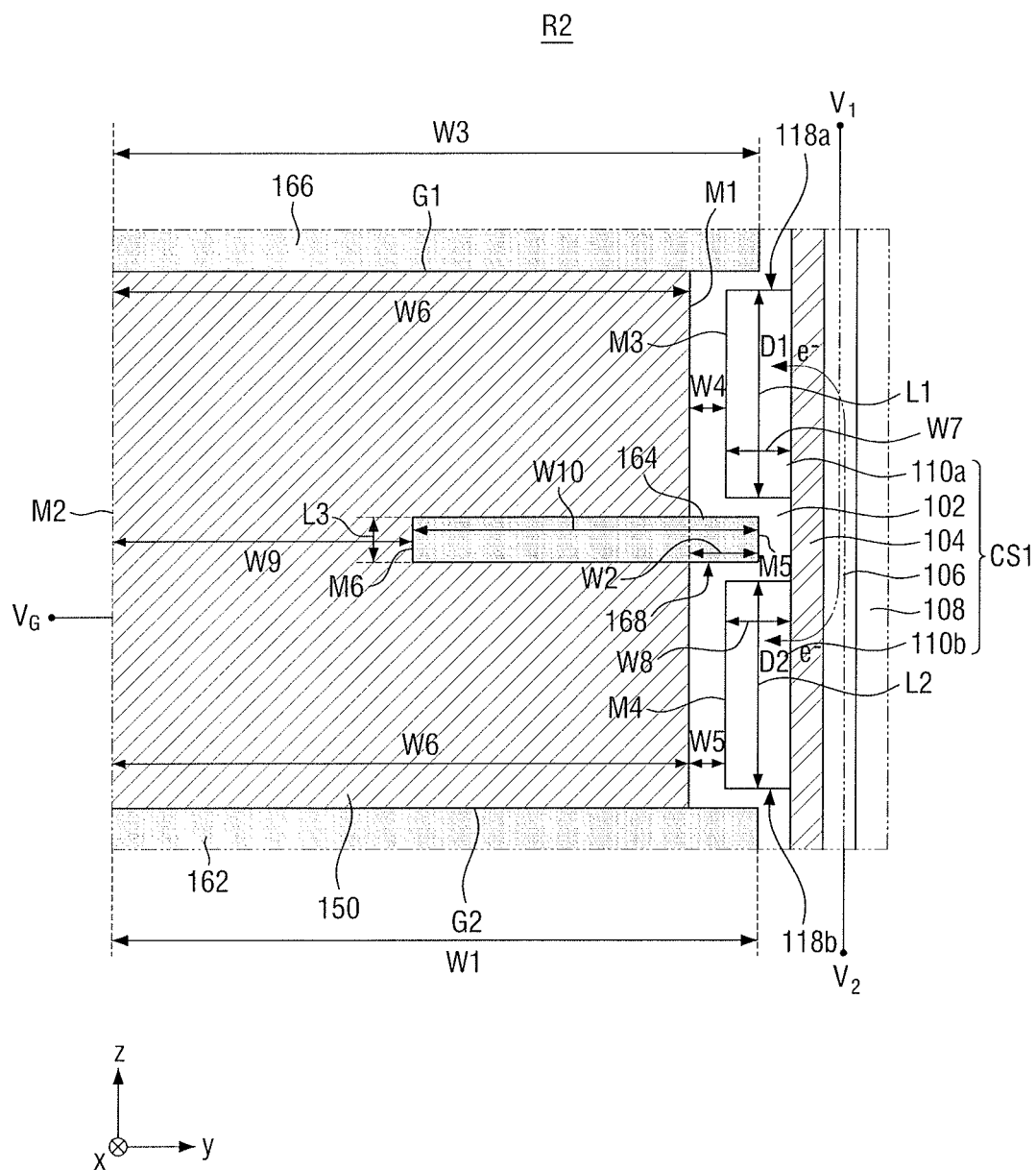
FIG. 20 illustrates an enlarged view of a region R2 of FIG. 19.

FIG. 20 is an enlarged view of the region R2 of FIG. 19. For reference, the following description will be made while focusing on differences from FIG. 4, and an overlapping part described with reference to FIG. 4 will be omitted.

Referring to FIG. 20, at least a part of the second insulating pattern 164 may be formed inside the gate electrode 150. As shown in FIG. 20, the second insulating pattern 164 may have a tenth width W10 defined from the sixth side M6 to the fifth side M5 where the second insulating pattern 164 meets the blocking insulating film 102.

In the semiconductor memory device according to an example embodiment, the third length L3 of the second insulating pattern 164 may be smaller than the first length L1 and/or the second length L2 or, for example, the third length L3 of the second insulating pattern 164 may be larger than ½ of the first length L1 and/or the second length L2. When the third length L3 of the second insulating pattern 164 becomes longer, the charges trapped between the first charge storage film 110a and/or the second charge storage film 110b may be more efficiently separated.

Although the first length L1 of the first charge storage film 110a and the second length L2 of the second charge storage film 110b are shown as being the same, the first length L1 of the first charge storage film 110a and the second length L2 of the second charge storage film 110b may be different from each other. Although the fourth width W4 and the fifth width W5 are shown as being the same, the fourth width W4 and the fifth width W5 may be different from each other.

The first width W1 of the first insulating pattern 162 and the third width W3 of the third insulating pattern 166 are shown as being the same, as an example. A distance from the first side M1 to the second side M2, that is, the sixth width W6 of the gate electrode 150 in the second direction Y, may be smaller than the first width W1 and/or the third width W3.

A length from the second side M2 to the fifth side M5 is equal to the sum of the sixth width W6 and the second width W2. A length from the second side M2 to the third side M3 is equal to the sum of the sixth width W6 and the fourth width W4. A length from the second side M2 to the fourth side M4 is equal to the sum of the sixth width W6 and a length of the second insulating pattern 164 protruding from the first side M1 in the second direction Y.

Although the sum of the sixth width W6 and the fourth width W4 may be the same as the sum of the sixth width W6 and the fifth width W5 as shown in the drawings, the sum of the sixth width W6 and the fourth width W4 and the sum of the sixth width W6 and the fifth width W5 may be different from each other.

In the semiconductor memory device according to an example embodiment, a length from the second side M2 to the fifth side M5 may be larger than the sum of the sixth width W6 and the fourth width W4. A length from the second side M2 to the fifth side M5 may be larger than the sum of the sixth width W6 and the fifth width W5.

As described above, the semiconductor memory device according to an example embodiment may independently store the charges in the first charge storage film 110a and the second charge storage film 110b through one gate electrode 150.

For example, referring to a two-dot chain line arrow direction along a direction D2 in FIG. 20, a gate voltage $V_G$ may be applied to the gate electrode 150. The gate voltage $V_G$ may be, for example, a positive voltage. A first voltage V1 may be applied to a top of the semiconductor pattern 106, and a second voltage V2 different from the first voltage V1 may be applied to a bottom of the semiconductor pattern 106. In one example, the first voltage V1 may be a ground voltage, and the second voltage V2 may be a positive voltage. In this case, the charges (electrons) provided from the top of the semiconductor pattern 106 may be selectively trapped in the second charge storage film 110b.

As another example, referring to a two-dot chain line arrow direction along a direction D1 in FIG. 20, the gate voltage $V_G$ may be applied to the gate electrode 150. The gate voltage $V_G$ may be, for example, a positive voltage. The first voltage V1 may be applied to the top of the semiconductor pattern 106, and the second voltage V2 different from the first voltage V1 may be applied to the bottom of the semiconductor pattern 106. In one example, the first voltage V1 may be a positive voltage, and the second voltage V2 may be a ground voltage. In this case, the charges (electrons) provided from the bottom of the semiconductor pattern 106 may be selectively trapped in the first charge storage film 110a.

Accordingly, the semiconductor memory device according to an example embodiment may implement two data storage elements per each gate electrode 150. Therefore, a semiconductor memory device with improved integration density may be provided.

In the semiconductor memory device of FIG. 20 according to an example embodiment, since the second insulating pattern 164 penetrates further into the gate electrode 150, the first charge storage film 110a and the second charge storage film 110b may be more insulated such that the first charge storage film 110a and the second charge storage film 110b may be better controlled separately from each other under control of the gate electrode 150. Thus, the second insulating pattern 164 further protruding into the gate electrode 150 may help efficiently separate control voltages that are applied to the first charge storage film 110a and the second charge storage film 110b.

FIGS. 21 to 24 are views showing intermediate processes for describing a method for fabricating the semiconductor memory device of FIG. 18 according to an example embodiment. In these embodiments, the same fabricating processes described with reference to FIGS. 7 to 13 are adopted so that the following description will be made while focusing on subsequent processes. The following description will be made while focusing on differences from FIGS. 14 to 17, and an overlapping part described with reference to FIGS. 14 to 17 will be omitted.

Figure 21:
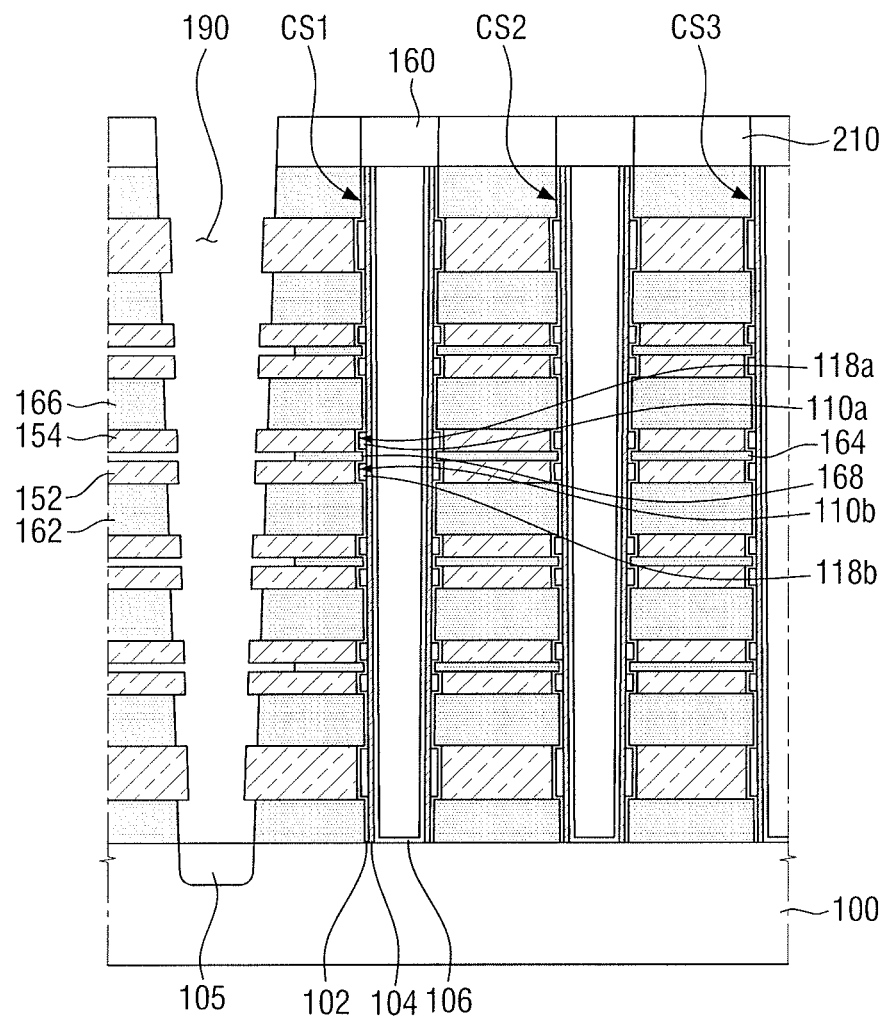
FIGS. 21 to 24 illustrate views showing intermediate processes in a method for fabricating the semiconductor memory device of FIG. 18 according to an example embodiment.

Referring to FIG. 21, parts of the first insulating pattern 162, the second insulating pattern 164, and the third insulating pattern 166 exposed by the slit region 190 may be etched. At this time, a speed at which the first insulating pattern 162 and the third insulating pattern 166 are etched may be different from a speed at which the second insulating pattern 164 is etched. Thus, the speed at which the second insulating pattern 164 is etched may be faster than the speed at which the first insulating pattern 162 and the third insulating pattern 166 are etched.

In the method for fabricating the semiconductor memory device according to an example embodiment, at least a part of the second insulating pattern 164 may remain between the first sacrificial film 152 and the second sacrificial film 154.

Figure 22:
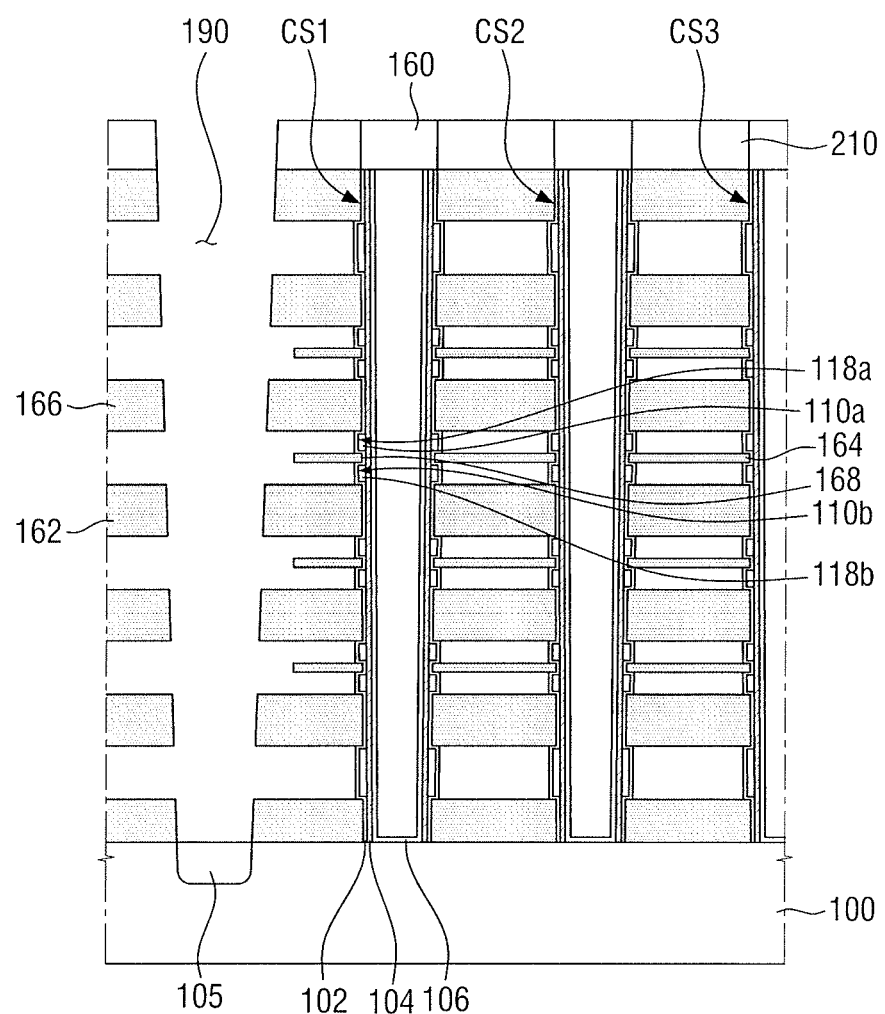

Referring to FIG. 22, the first sacrificial film 152 and the second sacrificial film 154 exposed by the slit region 190 may be removed. A wet etching process having an etch selectivity ratio with the first insulating pattern 162, the second insulating pattern 164, and the third insulating pattern 166 may be performed to remove the first sacrificial film 152 and the second sacrificial film 154, for example.

In the method for fabricating the semiconductor memory device according to an example embodiment, the second insulating pattern 164 may extend from the blocking insulating film 102 in the second direction Y to protrude from the side surface of the blocking insulating film 102 in a direction (−Y-direction) opposite to the second direction.

Figure 23:
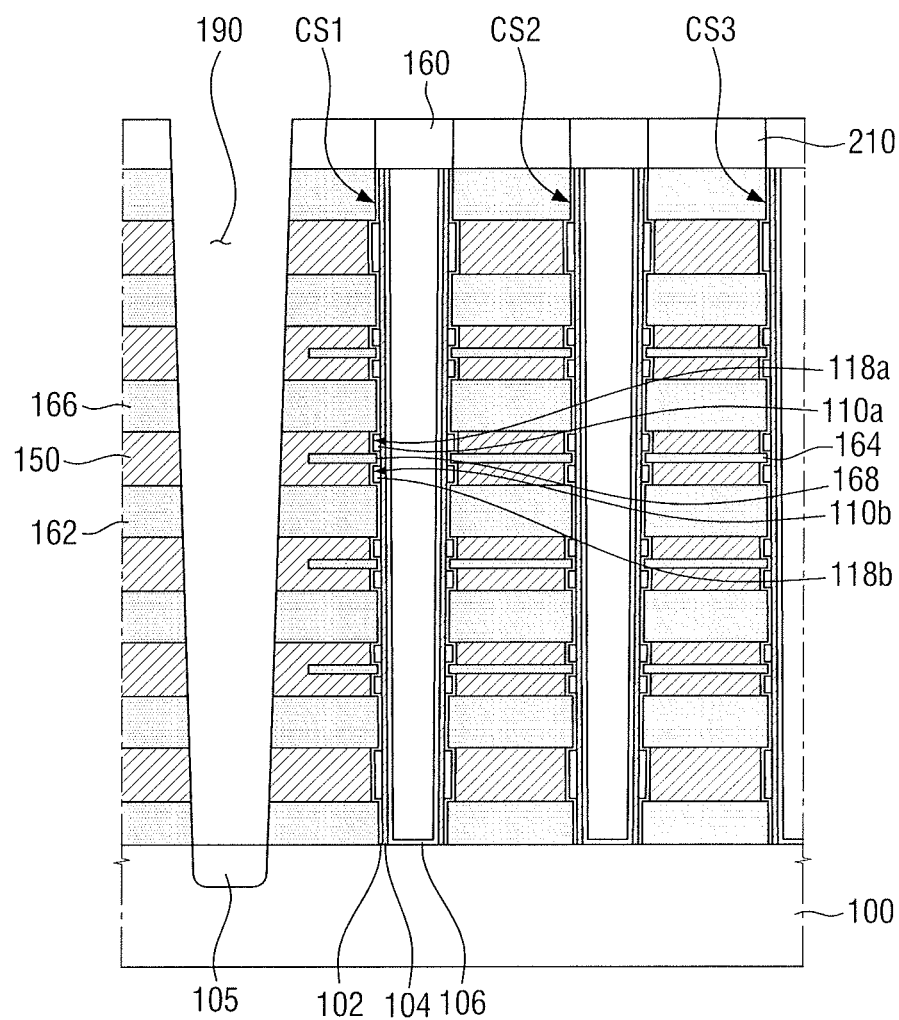

Referring to FIG. 23, the gate electrode 150 may be formed to occupy a space from which the first sacrificial film 152 and the second sacrificial film 154 of FIG. 22 are removed. The gate electrode 150 may be formed by depositing a conductive material such as a metal by atomic layer deposition (ALD) or chemical vapor deposition (CVD), or, for example, the gate electrode 150 may be formed by generating tungsten (W) nuclei and depositing bulk tungsten.

Figure 24:
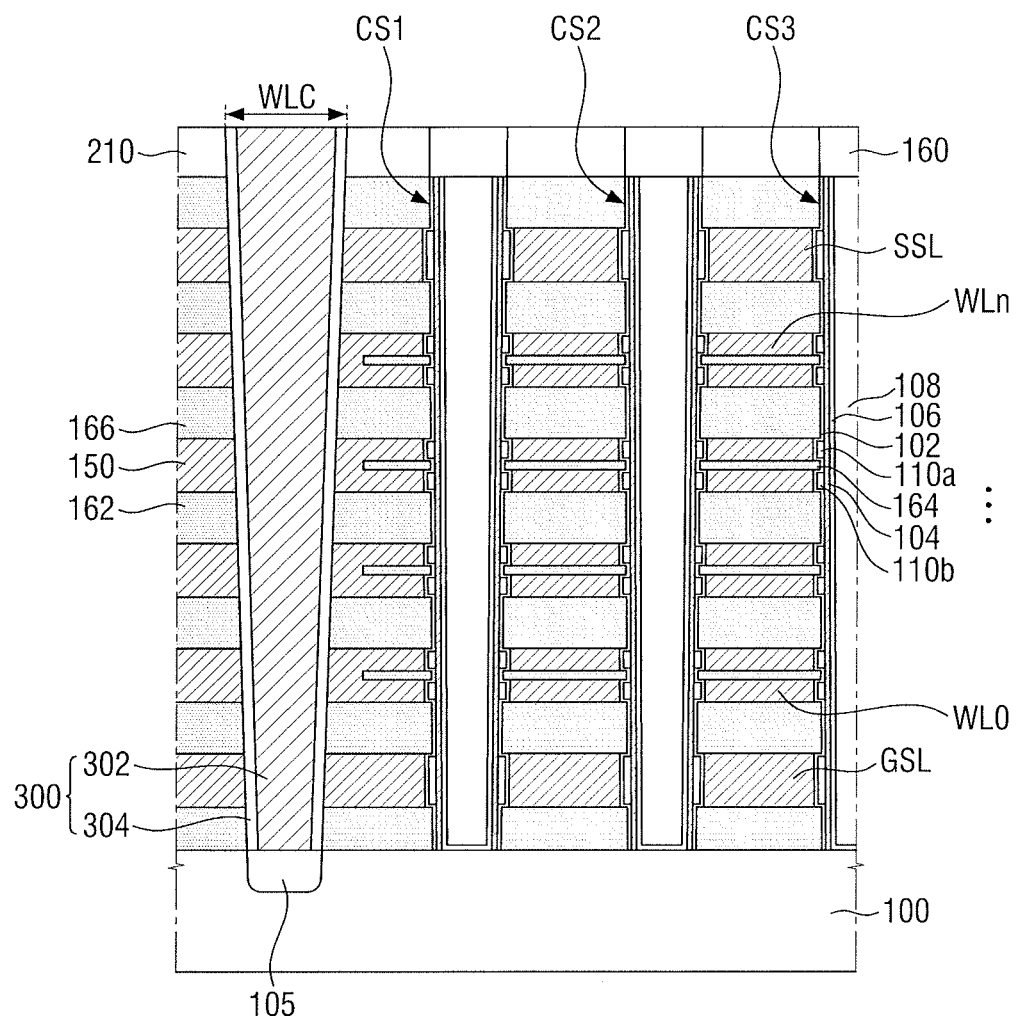

Referring to FIG. 24, the separation structure 300 may be formed in the slit region 190 to form the word line cut region WLC. For example, the spacer 304 that extends along a profile of the word line cut region WLC may be formed. Then, on the spacer 304, the plug pattern 302 that fills the word line cut region WLC may be formed.

Referring again to FIG. 18, the second interlayer insulating film 310 may be formed on the word line cut region WLC, the first interlayer insulating film 210, and the channel pad 160. The bit line contact 320 making contact with the channel pad 160 may be formed inside the interlayer insulating film 310. The bit line BL may be formed on the bit line contact 320 and the second interlayer insulating film 310 so that the semiconductor memory device of FIG. 18 according to an example embodiment may be formed.

As described above, embodiments relate to a semiconductor memory device including an insulating pattern configured to protrude from a gate electrode and between charge storage films, and a method for fabricating the semiconductor memory device. Embodiments may provide a semiconductor memory device with improved reliability by providing an insulating pattern configured to protrude from a gate electrode and between charge storage films. Embodiments may provide a method for fabricating a semiconductor memory device including an insulating pattern configured to protrude from a gate electrode and between charge storage films.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
   a third insulating pattern and a first insulating pattern on a substrate, the third insulating pattern and the first insulating pattern being spaced apart from each other in a first direction that is perpendicular to the substrate such that a bottom surface of the third insulating pattern and a top surface of the first insulating pattern face each other;
   a gate electrode between the bottom surface of the third insulating pattern and the top surface of the first insulating pattern, and including a first side extending between the bottom surface of the third insulating pattern and the top surface of the first insulating pattern; and
   a second insulating pattern that protrudes from the first side of the gate electrode by a second width in a second direction, the second direction being different from the first direction, wherein:
   the third insulating pattern has a third width in the second direction,
   the first insulating pattern has a first width in the second direction, and
   in the second direction, a sixth width of the gate electrode is smaller than the third width and smaller than the first width.

2. The semiconductor memory device as claimed in claim 1, wherein at least a part of the second insulating pattern is formed within the gate electrode.

3. The semiconductor memory device as claimed in claim 2, wherein:
the gate electrode includes a second side opposite to the first side,
the gate electrode includes a sixth side where the gate electrode meets the second insulating pattern, and
a sixth width of the gate electrode defined from the second side to the first side is longer than a ninth width of the gate electrode defined from the second side to the sixth side.

4. The semiconductor memory device as claimed in claim 3, wherein:
the third insulating pattern has a third width in the second direction,
the first insulating pattern has a first width in the second direction,
the second insulating pattern has a tenth width defined from the sixth side to a fifth side where the second insulating pattern meets a blocking insulating film, and
in the second direction, a sum of the ninth width of the gate electrode and the tenth width of the second insulating pattern is smaller than the third width and smaller than the first width.

5. The semiconductor memory device as claimed in claim 1, wherein the third width of the third insulating pattern is identical to the first width of the first insulating pattern.

6. The semiconductor memory device as claimed in claim 1, further comprising a blocking insulating film that extends along the second insulating pattern, the blocking insulating film being on the third insulating pattern, the first insulating pattern, and the gate electrode,
wherein the blocking insulating film includes a first charge storage film and a second charge storage film spaced apart from each other in the first direction.

7. The semiconductor memory device as claimed in claim 6, wherein the second insulating pattern is between the first charge storage film and the second charge storage film in the first direction.

8. The semiconductor memory device as claimed in claim 6, wherein a fourth width defined from the first side to the first charge storage film and a fifth width defined from the first side to the second charge storage film are shorter than the second width.

9. The semiconductor memory device as claimed in claim 8, wherein a seventh width in the second direction of the first charge storage film is identical to an eighth width in the second direction of the second charge storage film.

10. The semiconductor memory device as claimed in claim 9, wherein a sum of the fourth width and the seventh width of the first charge storage film in the second direction is longer than the second width.

11. A semiconductor memory device, comprising:
a semiconductor pattern on a substrate and extending in a first direction that is perpendicular to the substrate;
a tunnel insulating film on the semiconductor pattern;
a first charge storage film and a second charge storage film on the tunnel insulating film and spaced apart from each other in the first direction;
a blocking insulating film that extends on the tunnel insulating film along the first charge storage film and the second charge storage film, the blocking insulating film including a first portion that extends laterally in a second direction, which is perpendicular to the first direction, into a region between the first charge storage film and the second charge storage film;
a recess between the first charge storage film and the second charge storage film, and defined within the first portion of the blocking insulating film;
an insulating pattern that fills the recess; and
a gate electrode on the insulating pattern and the blocking insulating film.

12. The semiconductor memory device as claimed in claim 11, wherein:
the first charge storage film has a first length in the first direction,
the second charge storage film has a second length in the first direction, and
the first length is identical to the second length.

13. The semiconductor memory device as claimed in claim 12, wherein:
the insulating pattern has a third length in the first direction,
the third length is smaller than the first length and is smaller than the second length.

14. The semiconductor memory device as claimed in claim 11, wherein the insulating pattern extends into the gate electrode.

15. The semiconductor memory device as claimed in claim 14, wherein:
the gate electrode includes a first side where the gate electrode meets the blocking insulating film, a second side opposite to the first side, and a sixth side where the gate electrode meets the insulating pattern, and
in the second direction, a sixth width of the gate electrode defined from the first side to the second side is smaller than a sum of a ninth width of the gate electrode defined from the second side to the sixth side and a tenth width of the insulating pattern.

16. The semiconductor memory device as claimed in claim 11, wherein the first portion of the blocking insulating film contacts the tunnel insulating film between the first charge storage film and the second charge storage film.

17. A semiconductor memory device, comprising:
a blocking insulating film that extends in a first direction perpendicular to a substrate;
a first recess and a second recess defined within one surface of the blocking insulating film and spaced apart from each other in the first direction;
a third recess defined within an opposite surface of the blocking insulating film, and between the first recess and the second recess;
a first charge storage film that fills the first recess;
a second charge storage film that fills the second recess;
an insulating pattern that fills the third recess; and
a gate electrode that extends along the insulating pattern and the blocking insulating film.

18. The semiconductor memory device as claimed in claim 17, wherein the insulating pattern extends into the gate electrode.

19. The semiconductor memory device as claimed in claim 18, wherein:
the gate electrode includes a first side where the gate electrode meets the blocking insulating film, a second side opposite to the first side, and a sixth side where the gate electrode meets the insulating pattern, and
in a second direction intersecting the first direction, a sixth width defined from the first side to the second side is smaller than a sum of a seventh width defined from the second side to the sixth side and a tenth width of the insulating pattern.

20. The semiconductor memory device as claimed in claim 17, wherein:
- the first charge storage film has a first length in the first direction,
- the second charge storage film has a second length in the first direction,
- the first length is identical to the second length,
- the insulating pattern has a third length in the first direction, and
- the third length is smaller than the first length and smaller than the second length.

* * * * *